United States Patent
Maligeorgos et al.

(10) Patent No.: US 7,536,164 B2
(45) Date of Patent: May 19, 2009

(54) CONTROLLING THE FREQUENCY OF AN OSCILLATOR

(75) Inventors: James P. Maligeorgos, Austin, TX (US);
Dylan A. Hester, Austin, TX (US);
Augusto M. Marques, Austin, TX (US);
G. Tyson Tuttle, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 529 days.

(21) Appl. No.: 11/112,153

(22) Filed: Apr. 22, 2005

(65) Prior Publication Data
US 2006/0068744 A1 Mar. 30, 2006

Related U.S. Application Data

(60) Provisional application No. 60/651,501, filed on Sep. 30, 2004.

(51) Int. Cl.
*H04B 1/26* (2006.01)
(52) U.S. Cl. .......................... 455/318; 455/313; 455/86; 455/147; 455/196.1; 331/16; 331/17
(58) Field of Classification Search .................. 455/318, 455/313, 86, 147, 196.1; 331/16, 17
See application file for complete search history.

(56) References Cited

U.S. PATENT DOCUMENTS

| 3,754,152 | A | | 8/1973 | Koehler et al. |
| 4,710,730 | A | * | 12/1987 | Doyle, III .............. 331/116 FE |
| 4,977,380 | A | | 12/1990 | Martin et al. |
| 6,300,838 | B1 | * | 10/2001 | Kelkar .......................... 331/17 |
| 6,686,804 | B1 | | 2/2004 | Adams et al. |
| 6,959,217 | B2 | * | 10/2005 | DelMain et al. ............... 607/60 |
| 7,106,140 | B2 | * | 9/2006 | Mone .......................... 331/16 |

FOREIGN PATENT DOCUMENTS

EP    1 182 778    2/2002

OTHER PUBLICATIONS

U.S. Appl. No. 11/112,616 entitled, "Controlling The Frequency Of An Oscillator," filed on Apr. 22, 2005.

* cited by examiner

*Primary Examiner*—Sanh D Phu
(74) *Attorney, Agent, or Firm*—Trop, Pruner & Hu, P.C.

(57) ABSTRACT

A technique includes selectively coupling impedances to an oscillator to establish a first frequency of operation of the oscillator. The technique includes repeating the selective coupling in a feedback loop to cause the first frequency to be near a second frequency.

23 Claims, 20 Drawing Sheets

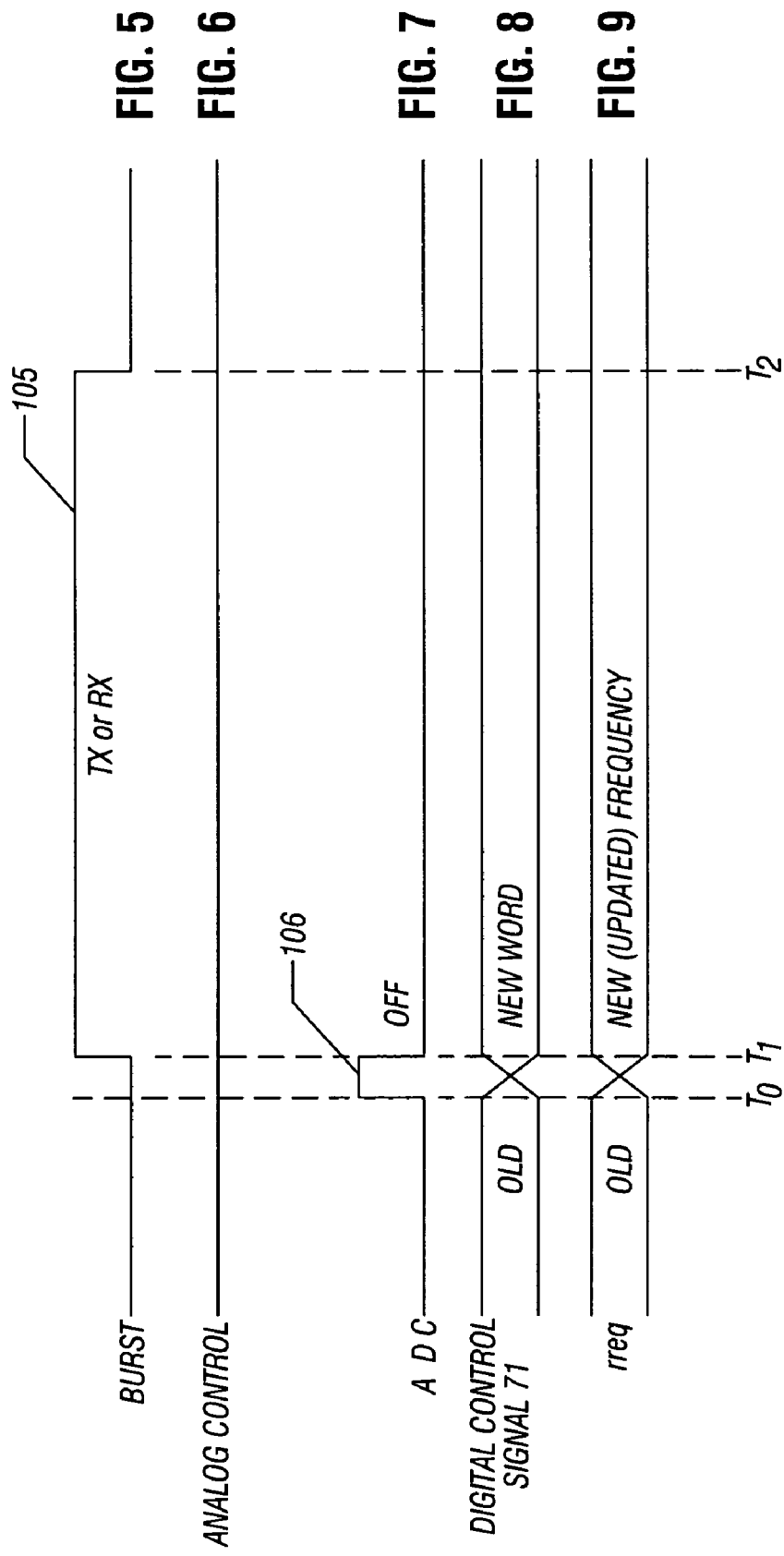

CONTROLLING THE FREQUENCY OF AN OSCILLATOR

This application claims the benefit under 35 U.S.C. § 119(e) U.S. Provisional Application Ser. No. 60/651,501, entitled "Controlling The Frequency Of An Oscillator," filed on Sep. 30, 2004.

BACKGROUND

The invention generally relates to controlling the frequency of an oscillator.

A personal wireless communication device (herein called a "wireless device"), such as a cellular telephone, includes various components, such as modulators, demodulators, frequency synthesizers, etc., that synchronize their operations to a reference clock signal. The reference clock signal may be generated from a sinusoidal reference signal that is provided by an oscillator of the wireless device.

The frequency of the sinusoidal reference signal (and thus, the frequency of the reference clock signal) is not fixed, but rather, a baseband controller of the wireless device may continually "fine tune" the frequency to synchronize communication between the wireless device and a base station. Thus, the wireless device typically controls the frequency of the oscillator in a feedback loop in response to the frequency of an incoming wireless signal from the base station.

FIG. 1 depicts a conventional system 10 that may be used in a wireless device to control the oscillation frequency of a crystal oscillator 24. The oscillator 24 provides a sinusoidal reference signal (at its output terminal 26) that is converted by other circuitry (not shown) into a reference clock signal for the wireless device. The system 10 includes a baseband control circuit 12 that receives an indication of the frequency of the incoming wireless signal and generates an analog signal (called "AFC") in an attempt to match the oscillation frequency of the oscillator 24 to the incoming frequency. The frequency of the incoming wireless signal may be determined, for example, by examining a particular time segment of the incoming wireless signal.

Based on the determined frequency of the incoming wireless signal, the baseband control circuit 12 typically generates digital data that indicates a frequency for the oscillator 24 (and thus, the frequency for the reference clock signal). Depending on the current clock frequency, the data may or may not indicate the current clock frequency. A digital-to-analog converter (DAC) 14 of the wireless device produces the AFC analog signal in response to the digital data. The AFC signal propagates through a low pass filter 18 before reaching a varactor 22, a component that is coupled to the oscillator 24 to control the oscillator's frequency (and thus, control the frequency of the reference clock signal).

The varactor 22 has a capacitance that is controlled by its DC bias operating point. Therefore, the AFC analog signal controls the DC bias and capacitance of the varactor 22. Because the varactor 22 is coupled to a resonant tank (not shown in FIG. 1) of the oscillator 24, the capacitance of the varactor 22 controls the oscillation frequency of the oscillator 24 and thus, controls the frequency of the reference clock signal.

SUMMARY

In an embodiment of the invention, a technique includes selectively coupling impedances to an oscillator to establish a first frequency of operation of the oscillator. The technique includes repeating the selective coupling in a feedback loop to cause the first frequency to be near a second frequency.

In another embodiment of the invention, a method includes establishing an oscillating current in a resonant tank. The method includes providing a resistor in series with the resonant tank to generate an indication of the current; and generating a clock signal in response to the indication.

In another embodiment of the invention, an apparatus includes impedances, an oscillator core and a circuit. The circuit selectively couples the impedances to the oscillator core to establish a first frequency of operation of the oscillator core and repeat the coupling in a feedback to cause the first frequency to be near a second frequency.

In another embodiment of the invention, an apparatus includes a resonant tank to provide an oscillating current. A resistor of the apparatus is coupled in series with the tank to generate an indication of the current. The apparatus includes a circuit to generate a clock signal in response to the indication.

In another embodiment of the invention, an article includes a storage medium that is readable by a processor-based system and stores instructions to, when executed, cause the system to communicate a digital representation of a first frequency of operation for an oscillator. The instructions when executed cause the system to regulate a timing of the communication to establish a rate limit at which the first frequency changes.

In yet another embodiment of the invention, a system includes a wireless interface and a transceiver. The wireless interface receives a wireless signal. The transceiver includes impedances, an oscillator core and a circuit. The oscillator core provides a reference signal for the transceiver having a first frequency. The circuit selectively couples the impedances to the oscillator core to establish the first frequency and repeat the coupling in a feedback loop to cause the first frequency to be near a second frequency of the wireless signal.

Advantages and other features of the invention will become apparent from the following description, drawing and claims.

BRIEF DESCRIPTION OF THE DRAWING

FIGS. 5, 6, 7, 8 and 9 are waveforms of the transceiver depicting generation of a digital signal to control an oscillation frequency according to an embodiment of the invention.

DETAILED DESCRIPTION

Figure 2:
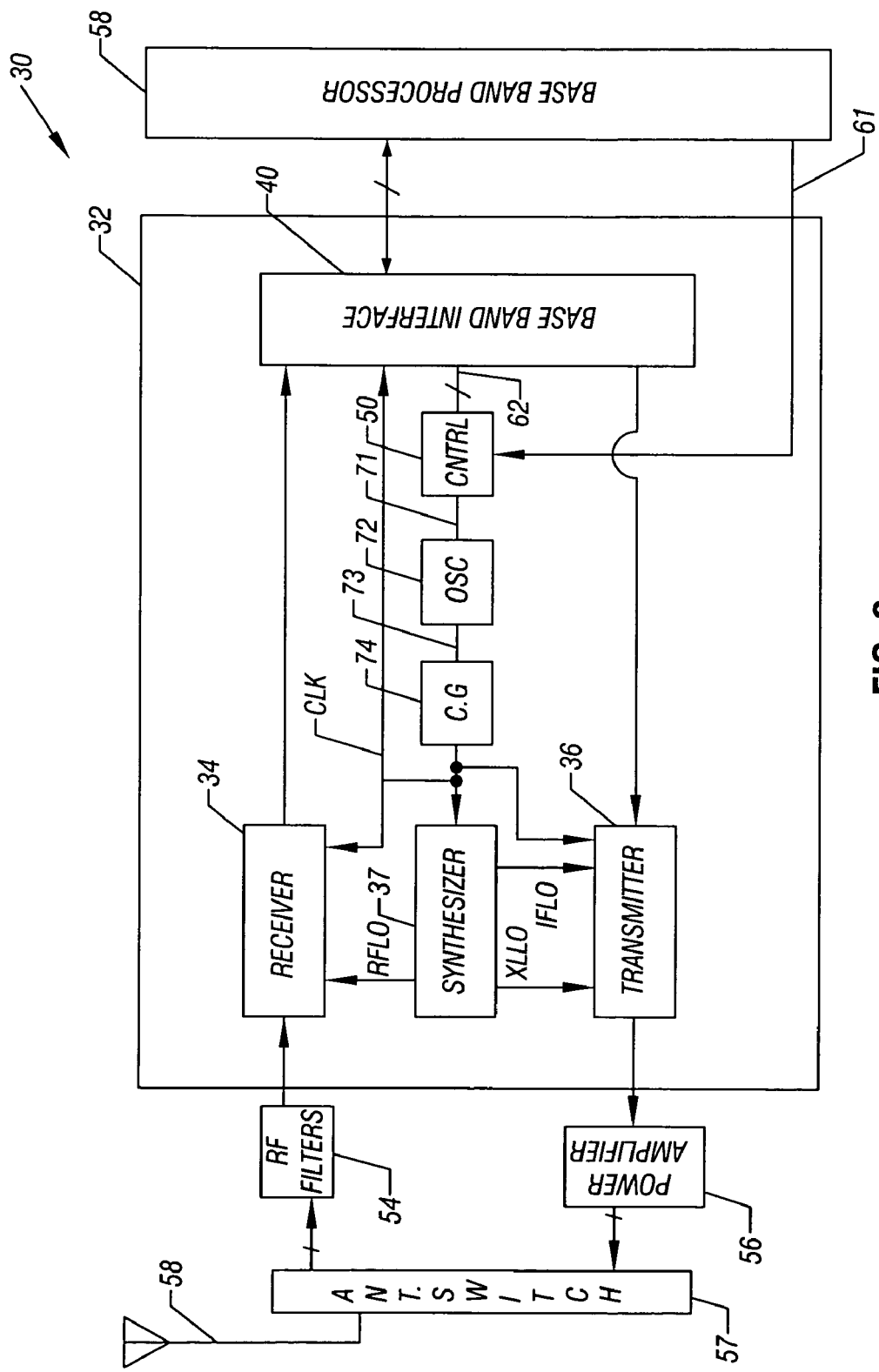
FIG. 2 is a schematic diagram of a transceiver according to an embodiment of the invention.

Referring to FIG. 2, in accordance with an embodiment of the invention, a wireless transceiver 32 (of a wireless system 30) includes an on-chip reference oscillator 72 that is constructed to be digitally-tuned. More particularly, the oscillator 72 is constructed to selectively couple impedances (capacitances, for example) to its resonant tank in response to a digital frequency control signal 71 (a word of digital data, for example). This digital control, in turn, may be used to both coarsely tune (tune to within 1.0 parts per million (ppm), for example) and finely tune (tune to within 0.1 ppm, for example) the fundamental frequency of oscillation (herein called the "oscillation frequency") of the oscillator 72.

The oscillator 72 oscillates at the oscillation frequency to produce a reference sinusoidal signal at its output terminal 73. In some embodiments of the invention, the fundamental frequency of the sinusoidal reference signal is the same as the oscillation frequency of the oscillator 72. A clock generator 74 of the transceiver 32 produces a reference clock signal (called "CLK") in response to the reference sinusoidal signal, and the CLK clock signal is used internally in the transceiver 32 to synchronize various operations of the transceiver 32.

The wireless system 30, in some embodiments of the invention, may be a personal wireless communication device (called a "wireless device" herein), such as a cellular telephone or personal digital assistant (PDA) with wireless capabilities, as examples. The wireless system 30 and other wireless and non-wireless systems that incorporate the circuits and/or techniques that are disclosed herein are within the scope of the appended claims.

The transceiver 32, in some embodiments of the invention, has both analog and digital frequency control interfaces, either of which may be used by circuitry that is external to the transceiver 32 for purposes of fine tuning the oscillation frequency. More specifically, in some embodiments of the invention, the transceiver 32 in its entirety may be fabricated on one or more semiconductor dies that are part of a single semiconductor package. In these embodiments of the invention, one or both of the analog and digital frequency control interfaces may include one or more external pins of this semiconductor package. Thus, one or more of the external pins of the semiconductor package may form one or more input terminals of the analog frequency control interface; and one or more of the external pins of the semiconductor package may form one or more input terminals of the digital frequency control interface.

Figure 1:
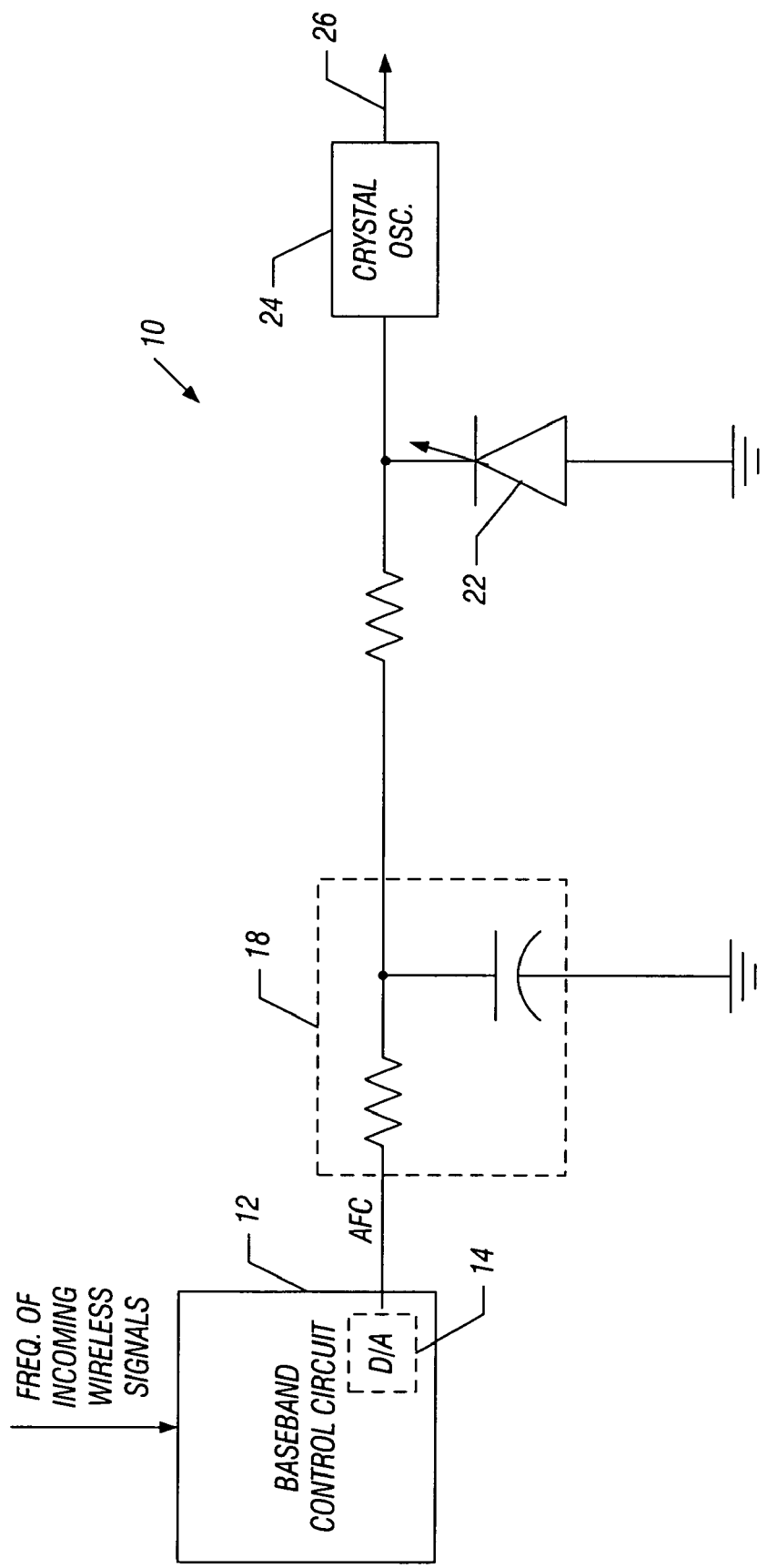
FIG. 1 is a schematic diagram of a system to control an oscillator of the prior art.

Although one solution for digitally controlling the fine tuning of the oscillator 72 may include moving a DAC, such as the DAC 14 (see FIG. 1), from a baseband control circuit (such as the baseband control circuit 12 of FIG. 1) to the transceiver, such a control may not address the potential scenario in which a baseband control circuit provides an analog signal to the transceiver for purposes of controlling the oscillation frequency. Therefore, referring to FIG. 2, the transceiver 32, in accordance with some embodiments of the invention, includes a frequency control circuit 50 that includes both the above-mentioned analog and digital frequency control interfaces for controlling the oscillation frequency.

Figure 3:
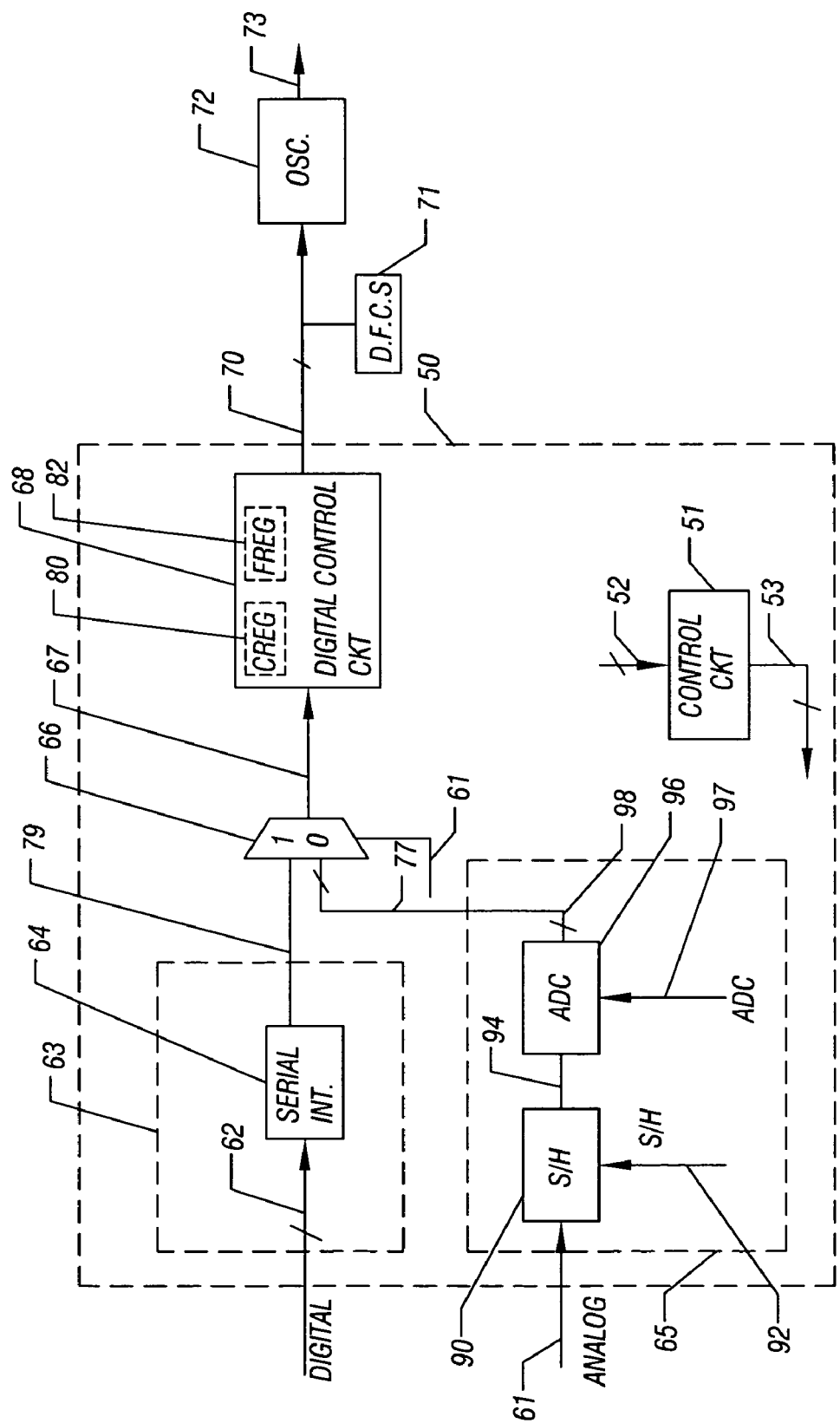
FIG. 3 is a schematic diagram of a frequency control interface of the transceiver according to an embodiment of the invention.

Referring to FIG. 3, more specifically, in some embodiments of the invention, the circuit 50 includes a first digital interface 63 for purposes of receiving a digital signal to digitally control an oscillation frequency of the oscillator 72 and a second analog input interface 65 for purposes of controlling the oscillation frequency via an analog input signal.

The digital interface 63 includes digital input lines 62 that may be, for example, input lines that are coupled to a serial bus (of the wireless system 30) that, in turn, is coupled to a baseband subsystem 58 that is separate from the transceiver 32. The digital input lines 62 may be coupled to external pins of a semiconductor package that contains the transceiver 32. A serial port interface 64 of the circuit 50 receives the digital signal over the lines 62 and provides output lines 79 of the interface 63.

When digital control of the oscillation frequency is desired, a multiplexer 66 of the circuit 50 selects the output lines 79 of the serial port interface 64 and provides the digital signal from the interface 64 to input lines 67 of a digital control circuit 68. The digital control circuit 68, in turn, stores the digital signal in either a fine tuning register 82 or a coarse tuning register 80 of the circuit 68, as further described below. The fine tuning 82 and coarse tuning 80 registers may be individually addressable by circuitry (such as the baseband control subsystem 58) that is external to the transceiver 32, in some embodiments of the invention.

The digital control circuit 68 potentially processes (as described further below) the values that are stored in the registers 80 and 82 to produce another digital signal (called the "digital frequency control signal 71" herein). The digital frequency control signal 71 is communicated (via communication lines 70) to the oscillator 72 that sets its oscillation frequency in response thereto.

The transceiver 32 may be used with circuitry that alternatively provides an analog signal (instead of a digital signal), such as the baseband control subsystem 58, that alternatively provides an analog signal (instead of a digital signal) for purposes of controlling the oscillation frequency. More specifically, to accommodate such circuitry, the analog input interface 65 includes an analog control input line 61 that is designed to receive an analog frequency control signal that indicates the oscillation frequency. The input line 61, in turn, is coupled to an input terminal of an analog-to-digital converter (ADC) 96 (a continuous time delta sigma converter, for example).

The ADC 96 converts the voltage appearing on the analog control input line 61 into a digital signal that appears on output terminals 98 of the ADC 96. When analog control of the oscillation frequency is desired, the multiplexer 66 selects the output lines 98 and thus, couples the input lines 77 of the multiplexer 66 to input lines 67 of the digital control circuit 68. In response to the digital signal from the ADC 96, the digital control circuit 68 stores the digital signal in the appropriate register 80 and 82, potentially processes the signal further (as described below) and then provides the corresponding digital frequency control signal 71 to the oscillator 72.

Thus, the transceiver 32 has a digital input mode in which the digital interface 63 is used to control the oscillation frequency of the oscillator 72 and an alternative analog input mode in which the analog interface 65 is used to control the oscillation frequency.

In some embodiments of the invention, the analog interface 65 has a power conservation mode in which parts of the interface 65 are powered down when not being used. This power conservation mode may be particularly advantageous, for example, when the wireless device is a battery-powered device.

As an example of the power conservation features of the analog interface 65, in some embodiments of the invention, the ADC 96 may be selectively turned on and off, depending on whether the function of the ADC 96 is needed. More particularly, in some embodiments of the invention, the ADC 96 receives a control signal (called "ADC") on a control terminal 97 of the ADC 96 for purposes of controlling when the ADC 96 is active. In some embodiments of the invention, on assertion of the ADC signal, the ADC 96 becomes active at which point the ADC 96 converts the voltage on the analog control input line 61 into the digital signal that appears on the output terminals 98. Thus, the ADC 96 only provides a digital signal in response to the assertion of the ADC signal.

Controlling the ADC 96 in the above-described manner may be advantageous for purposes of only updating the oscillation frequency periodically. More specifically, automatic frequency control in a radio device may present a significantly slow feedback loop so that the ADC 96 only needs to operate periodically. For GSM, the ADC 96 may only need to convert before the beginning of a particular burst operation in the transceiver. Thus, the ADC 96 may be powered off in other time segments of operation to conserve power.

In some embodiments of the invention, a control circuit 51 generates the ADC signal (on one of many possible control lines 53). The control circuit 51 may have its control of the ADC 96 on a variety of different factors, whether or not a burst operation is to occur, as further described below. The control circuit 51 may have one or more input lines 52 for communicating with other circuitry of the transceiver, sensing a state of the transceiver 32, detecting a burst operation, etc.

An exemplary burst operation 105 is depicted in FIG. 5. As shown, the burst operation 105 lasts from time $T_1$ to time $T_2$. In anticipation of the upcoming burst operation 105, the control circuit 51 pulses the ADC signal (as shown by the pulse 106) at time $T_0$, as depicted in FIG. 7. Thus, by time $T_1$, the time at which the burst operation 105 begins, the digital frequency control signal 71 and thus, the frequency of the crystal oscillator 72 has been updated, as depicted in FIGS. 8 and 9.

Regardless of whether the analog 65 or digital 63 interface is used is used by circuitry to control the oscillation frequency, the frequency is digitally-controlled. In other words, regardless of the source (an analog or digital signal from the baseband subsystem (FIG. 2)) of the control, the digital control interface 68 generates the digital frequency control signal 71 (FIG. 3) to digitally control the oscillation frequency pursuant to a technique 100 that is depicted in FIG. 4.

Figure 4:
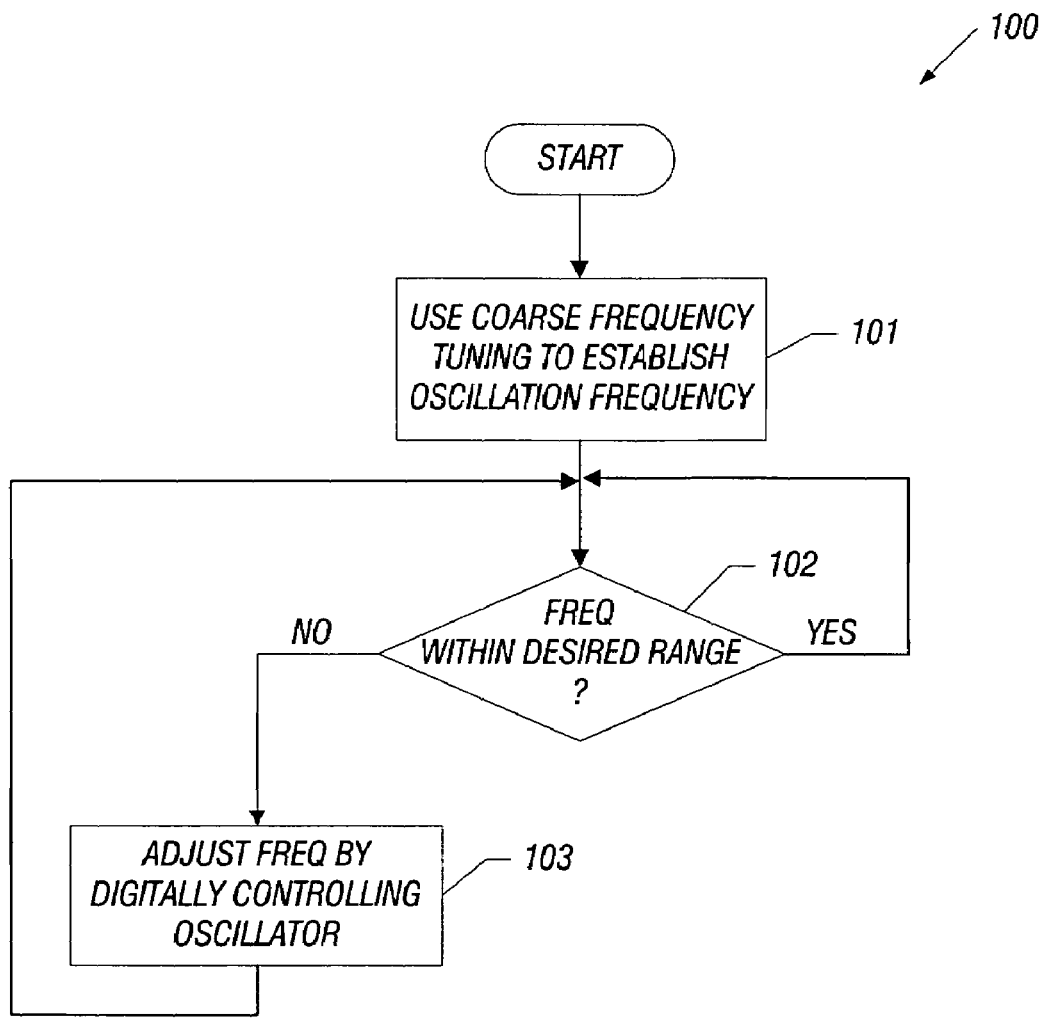
FIG. 4 is a flow diagram depicting a technique to fine tune the oscillator according to an embodiment of the invention.

Referring to FIG. 4, the technique 100 includes using a coarse frequency adjustment (an adjustment to within 1 part per million (ppm) of the target frequency, for example) to establish the basic oscillation frequency, as depicted in block 101. This may be accomplished by writing a particular data value to the coarse tuning register 80 (FIG. 3) through either the analog 65 or digital 63 input interface. In response to this data and possible further processing, the digital control interface 68 communicates the digital frequency control signal 71 to the oscillator 72 to cause the oscillator 72 to connect the appropriate capacitors to the oscillator's resonant tank, as further described below.

Next, pursuant to the technique 100, a fine tuning (tuning to with 0.1 ppm of the target frequency, for example) feedback loop begins. More particularly, the technique 100 includes determining (diamond 102) whether the frequency of the oscillator 72 is within a desired range. This determination is based, at least in part, on the frequency of the wireless signal that is received from the wireless base station. The technique 100 includes digitally controlling the oscillator 72 to adjust the oscillation frequency, as depicted in block 103. This digital control includes continually updating (via either interface 63 or 65) the value that is stored in the fine tuning register 82 to cause the digital control interface 68 to continually update the digital frequency control signal 71. Control transitions back and forth between block 103 and diamond 102 to create a feedback loop for fine tuning the oscillation frequency of the oscillator 72.

In some embodiments of the invention, the transceiver 32 may be incorporated into a wireless system, such as the exemplary wireless system 30 that is depicted in FIG. 2. Referring back to FIG. 2, as part of this system 30, the transceiver 32 may include, a receiver 34 and a transmitter 36. The receiver 34 may be a heterodyne or a homodyne receiver, depending on the particular embodiment of the invention. A heterodyne receiver may include a low intermediate frequency (IF) architecture. In some embodiments of the invention, the transmitter 36 may be a direct up or a heterodyne transmitter. For embodiments of the invention in which the transmitter 36 is a heterodyne transmitter, the heterodyne transmitter may incorporate an offset phase locked loop (PLL) architecture.

As depicted in FIG. 2, in some embodiments of the invention, a synthesizer 37 of the transceiver 32 may provide a radio frequency (RF) local oscillator signal to the receiver 34; and furthermore, the synthesizer 37 may provide both an RF local oscillator signal and an IF local oscillator signal to the transmitter 36. Depending on the particular embodiment of the invention, the synthesizer 37 may incorporate an RF PLL or an IF PLL or a combination of both of these components. The main function of the synthesizer 37 is to provide local oscillator signals to the receiver 34 and the transmitter 36. These local oscillator signals, in turn, are generated by the synthesizer 37 in response to the CLK reference clock signal that is provided by the clock generator 74.

As depicted in FIG. 2, in some embodiments of the invention, the CLK reference clock signal may also be provided (in addition to the synthesizer 37) to the receiver 34, the transmitter 36 and a baseband interface 40. Collectively, the clock generator 74, oscillator 72 and control circuit 50 may be referred to as the reference block.

As its name implies, the baseband interface 40 forms an interface for the transceiver 32 to an external baseband processor 58, in some embodiments of the invention. The baseband interface 40 may be a digital interface, an analog interface or a combination of a digital and an analog interface, depending on the particular embodiment of the invention. Among its other features, in some embodiments of the invention, the wireless system 30 may include power amplifiers 56 for purposes of amplifying the RF signals to be provided to an antenna 58 and RF filters 54 for purposes of filtering an RF signal received from the antenna 58. Furthermore, the wireless system 30 may include an antenna switch 57 that is coupled between the RF filters 54 and the power amplifier 56.

In some embodiments of the invention, the baseband processor 58 may be coupled to or form part of an application subsystem that may include various input devices, such as a keyboard and an output device for purposes of forming an interface with a user of the wireless system 30. Furthermore, in some embodiments of the invention, this application subsystem may execute various application programs for purposes of interfacing with a user of the wireless system 30.

The wireless system 30, as well as the transceiver 32, illustrate only a few out of the many possible embodiments of circuitry that may employ the oscillation frequency control techniques and interfaces that are disclosed herein.

In some embodiments of the invention, the fine tuning of the oscillator's frequency is controlled by a bank of capacitors that are selectively coupled to and isolated from a resonant tank of the oscillator 72 in response to the digital frequency control signal 71. More specifically, referring to FIG. 10, in some embodiments of the invention, the oscillator 72 includes a capacitor bank 122 that is coupled by a capacitor array line 125 to an oscillator core 120. The capacitance that appears on the line 125 controls the oscillation frequency of the oscillator core and therefore, controls the oscillation frequency of the reference sinusoidal signal that appears on an output terminal 73 of the oscillator core 120 (and oscillator 72).

For purposes of controlling the level of capacitance that appears on the line 125, the oscillator 72 includes a selection circuit 124 that selectively establishes connections between the capacitors of the capacitor bank 122 and ground. One terminal of each capacitor of the bank 122 is coupled to the line 125. In response to the digital frequency control signal 71, the selection circuit selectively couples the capacitors of the bank 122 to ground so that when the selection circuit 124 couples a particular capacitor of the bank 122 to ground, the capacitor becomes coupled to the resonant tank and contributes to the capacitance of the line 125. Otherwise, the capacitor remains isolated from the resonant tank and does not contribute to the capacitance of the line 125.

The selection of which capacitors of the bank 122 are coupled to ground is made in response to the frequency control signal 71. The frequency control signal 71 is a multi-bit digital signal (a word of data, for example), in some embodiments of the invention, which indicates the oscillation frequency. For example, in some embodiments of the invention, some of the most significant bits (MSBs) of the frequency control signal 71 may be associated with a value that is stored in the coarse frequency control register 80 (FIG. 3) and thus, establish the coarsely-tuned frequency of the oscillator 72. Therefore, these MSBs establish the frequency of the oscillator 72 to about one part per million (ppm), in some embodiments of the invention. In contrast, the bits of the less significant bits of the frequency control signal 71 may be associated with the fine tuning of the frequency of oscillation. In this regard, these bits may be associated with fine tuning the oscillation frequency to about 0.1 or even 0.01 ppm, depending on the particular embodiment of the invention.

In some embodiments of the invention, the coarse setting of the oscillation frequency is a one-time event. For example, the coarse frequency register 80 may be programmed at the initialization (at power up, for example) of the transceiver 32. Alternatively, the value may be permanently programmed into the register 80 by the manufacturer of the wireless system 30.

During the course of operation of the transceiver 32, however, the frequency of operation of the oscillator 72 continually changes in a feedback loop due to updates (via writes to the fine tuning register 82) to the less significant bits of the frequency control signal 71. It is noted that this ongoing feedback loop synchronizes the frequency of the reference clock signal to the frequency of the wireless signal that is received from the base station.

For purposes of simplifying the discussion herein, in general, references are not made below to "fine tuning" and "coarse tuning." It is assumed unless otherwise stated that references to the tuning of the oscillation frequency are referring to the fine tuning of the oscillation frequency.

Figures 10, 11:
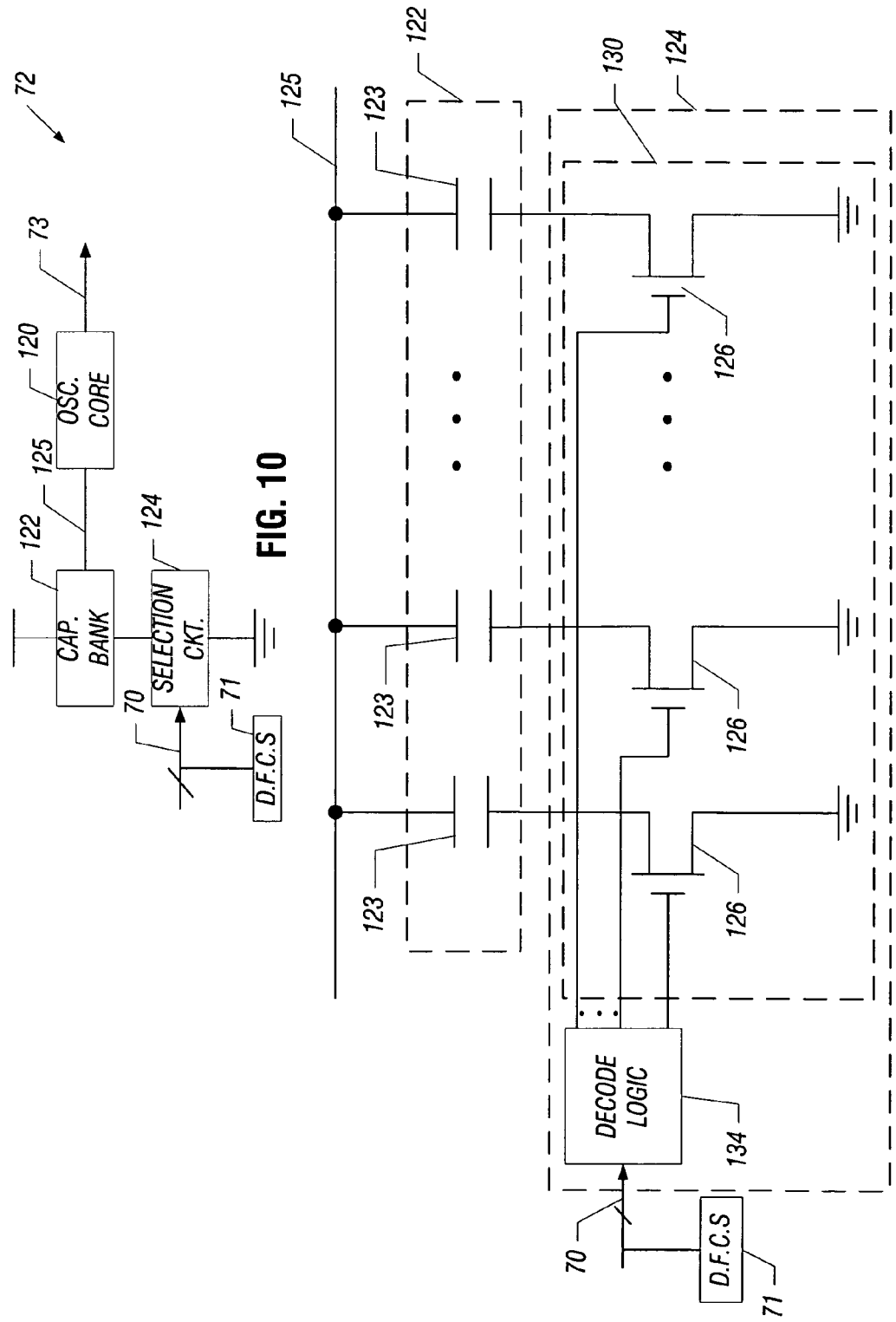
FIG. 10 is a block diagram of an oscillator according to an embodiment of the invention.
FIGS. 11 and 12 are schematic diagrams depicting a frequency selection circuit of the oscillator according to different embodiments of the invention.

The selection circuit 124 may take on various forms, depending on the particular embodiment of the invention. For example, FIG. 11 depicts the selection circuit 124 as including decode logic 134 ("thermometer decode logic," for example) that, in response to the digital frequency control signal 71 generates select signals to selectively control the activation of n-channel metal-oxide-semiconductor field-effect-transistors (nMOSFETs) 126. The nMOSFETs 126 form an array 130 of selection devices that are controlled by the decode logic 134 for purposes of selectively coupling associated capacitors 123 (of a capacitor bank 124) between the line 125 and ground.

The drain terminal of each nMOSFET 126 is coupled to one terminal of an associated capacitor 123. The source terminal of each nMOSFET 126 is coupled to ground; and the gate terminal of each nMOSFET 126 receives a binary selection signal from the decode logic 134. Thus, the activation (via its gate terminal) of a particular nMOSFET 126 connects the associated capacitor 123 to ground and thus, adds capacitance to the line 125. This additional capacitance, in turn, changes the oscillation frequency. Likewise, the de-activation (turning off, for example) of a particular nMOSFET 126 (via its gate terminal) removes capacitance from the line 125 and thus, affects the oscillation frequency in the opposite direction.

In some embodiments of the invention, the capacitors 123 may each have the same unit capacitance. In other words, the decode logic 134 determines, based on the digital control word, how many of the capacitors 123 are to be coupled to the line 125 and activates the appropriate number of nMOSFETs 126.

Figure 12:
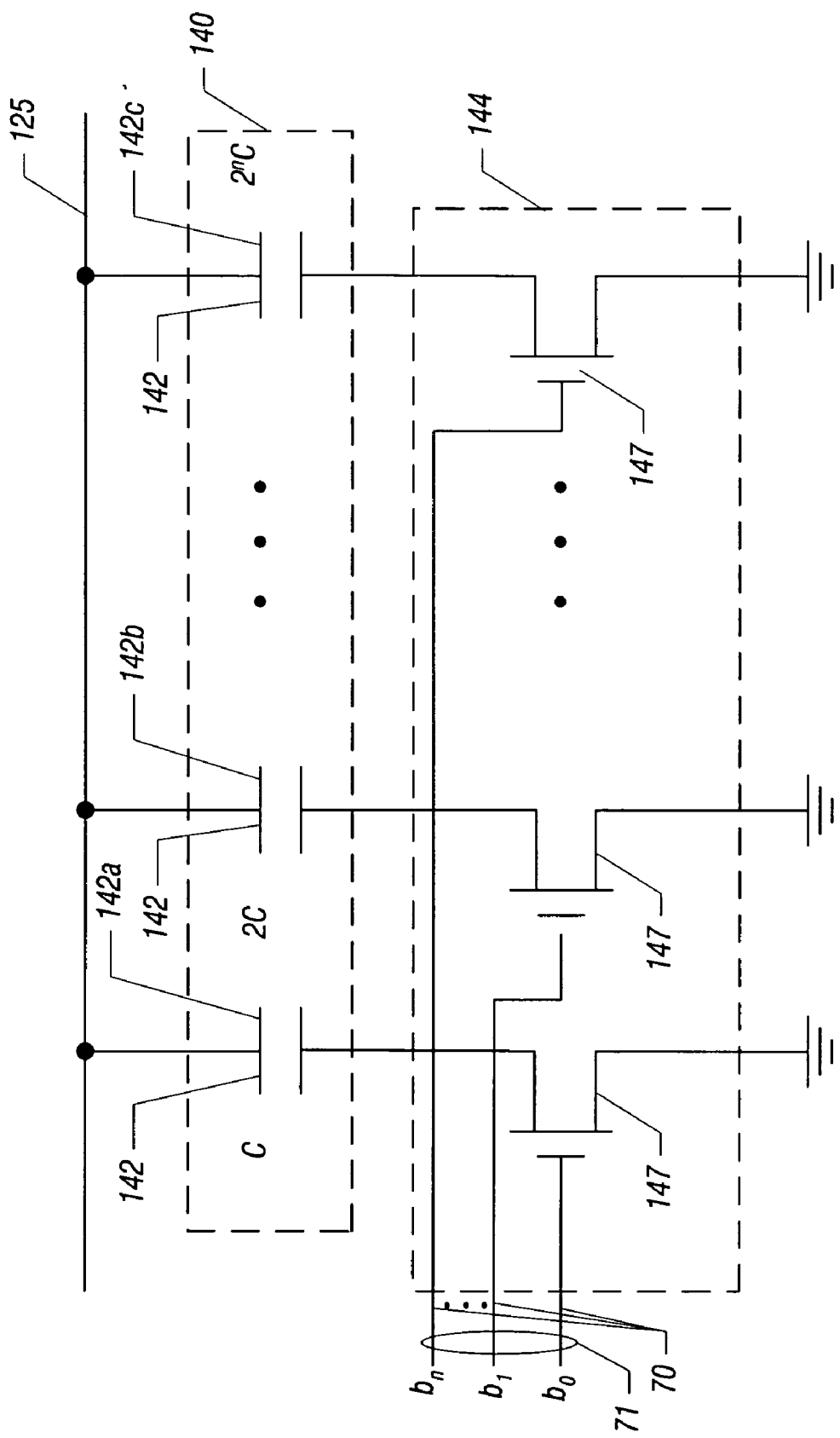

It is noted that many other embodiments are possible and are within the scope of the appended claims. For example, in other embodiments of the invention, the selection circuit 124 may have a form that is depicted in FIG. 12. More specifically, the nMOSFETs 126 (FIG. 11) of the selection array 130 are replaced with nMOSFETs 147 of a selection array 144. Physically, the structure that is depicted in FIG. 12 is the same as the structure that is depicted in FIG. 11, except that the decode logic 134 is not present. Instead, the gate terminals of each of the nMOSFETs 147 directly receives a particular bit of the frequency control signal 71. Furthermore, instead of each being associated with a capacitor of the same unit size, in FIG. 12, each nMOSFET 147 selectively couples a binarily-weighted capacitor 142 (of a capacitor array 140) to ground. All of the MOSFETs 147 are not the same size, as they may be binarily weighted, in some embodiments of the invention.

Due to the binary weighting, the more significant bits of the digital frequency control signal 71 control the coupling of the more significant capacitance to the line 125. Thus, for example, bit $b_n$ (i.e., the nth most significant bit of the frequency control signal 71) controls whether a capacitance of $2^n$ C (where "C" represents a unit value) is coupled to ground. The least significant bit $b_0$ of the frequency control signal 71 controls whether the unit capacitance C is coupled to ground. Continuing the example, the $b_1$ bit of the frequency control signal 71 controls whether the capacitance 2C is coupled to ground and thus, coupled to the line 125.

Figure 13:
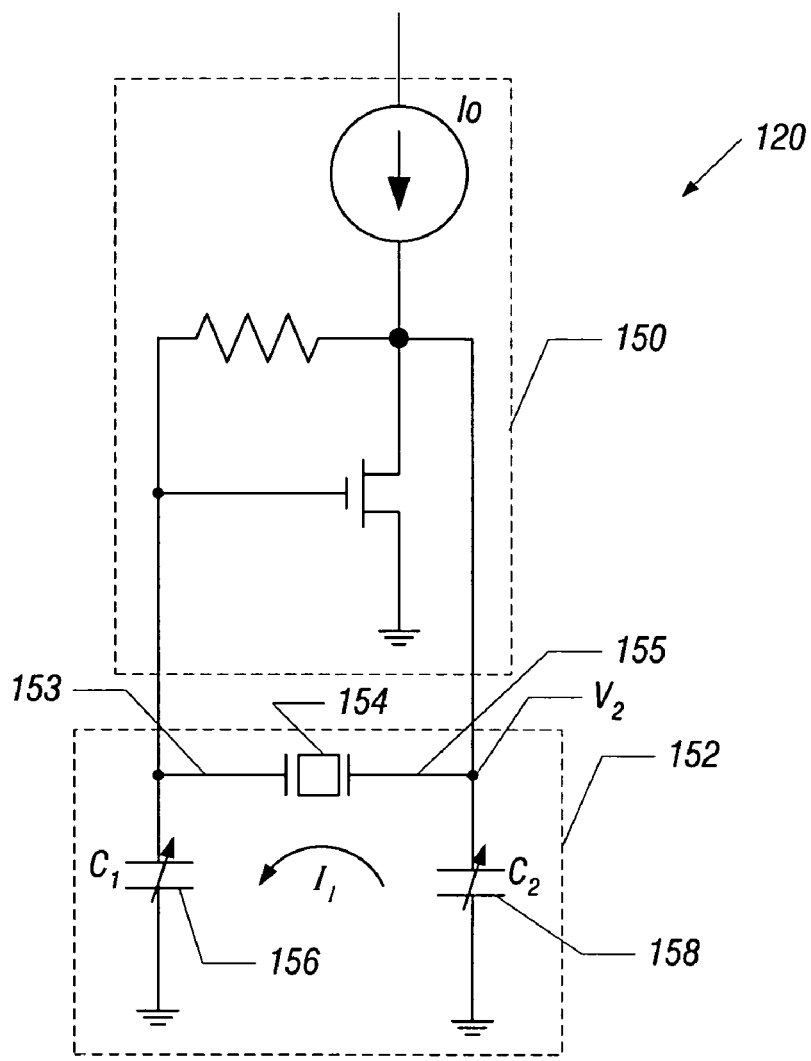
FIG. 13 is a schematic diagram of an oscillator core according to an embodiment of the invention.

In some embodiments of the invention, the oscillator core 120 may have a Colpitts oscillator topology, as depicted in FIG. 13. In these embodiments of the invention, the oscillator core 120 may include an amplifier 150 that is coupled between nodes called $V_1$ (providing a $V_1$ voltage) and $V_2$ (providing a $V_2$ voltage). The nodes $V_1$ and $V_2$, in turn, are nodes of a resonant tank 152 of the oscillator 120. The basic Colpitts configuration includes a capacitor 156 that is coupled between the node $V_1$ and ground and another capacitor 158 that is coupled between the node $V_2$ and ground.

As depicted in FIG. 13, in some embodiments of the invention, the capacitors 156 and 158 may both be variable capacitors and have capacitances $C_1$ and $C_2$, respectively. The $C_1$ and $C_2$ capacitances, in turn, represent the capacitance that may be selectively coupled to the resonant tank 152 in response to the frequency control signal 71. Thus, in some embodiments of the invention, the oscillator 72 may include more than one capacitance array line 125 and may, in turn, include mirrored capacitor banks, one of which is coupled to the node $V_1$ and the other of which is coupled to the node $V_2$. In these embodiments of the invention, changes to the capacitance $C_1$ may occur concurrently with changes to the capacitance $C_2$.

As depicted in FIG. 13, the resonant tank 152 includes a crystal 154 (also called a "crystal resonator") that is coupled between the nodes $V_1$ and $V_2$. As shown in FIG. 13, a current $I_1$ flows in a path containing the capacitors 156 and 158 and the crystal 154. An insignificant level of current flows into or out of the amplifier 150, as compared to the current $I_1$. Thus, for simplification, it is assumed that no current from the resonant tank 152 flows into or out of the amplifier 150. As depicted in FIG. 13, in some embodiments of the invention, the amplifier 150 may be an nMOS amplifier that is formed from a current source and an nMOSFET transistor. Other types of amplifiers are possible in other embodiments of the invention. Furthermore, in other embodiments of the invention, oscillator topologies other than a Colpitts topology may be used.

For purposes of extracting the sinusoidal reference signal from the resonant tank 152, the signal may be taken either from the node $V_1$ voltage, the $V_2$ voltage or some combination of these voltages. In some embodiments of the invention, the node $V_1$ may be chosen to provide the sinusoidal reference signal and is thus coupled to the output line 73.

Figure 14:
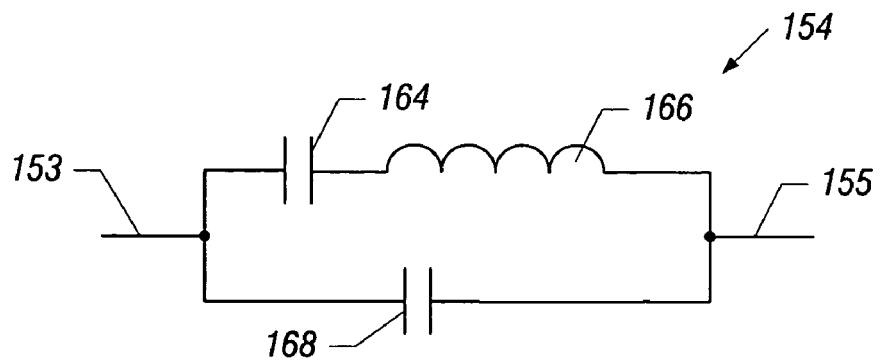
FIG. 14 is an illustration of an electrical schematic representation of a crystal.

Referring to an electrical model of the crystal 154 in FIG. 14, the model includes a capacitor 164 and an inductor 166 that are coupled in series between the terminals 153 and 155 of the crystal 154. This electrical model also includes a capacitor 168 that is connected in parallel to the series combination of the capacitor 164 and the inductor 166 and is connected between the terminals 153 and 155.

The fundamental mode of oscillation of the oscillator 120 is that of a series resonance inductance capacitance (LC)-type oscillator in which a large sinusoidal current $I_1$ flows through the capacitors 156 and 158 and the crystal 154. The $V_1$ voltage is described by the following equation:

$$V_1 = \frac{I_1}{sC_1},\qquad\text{Equation 1}$$

The $V_2$ voltage is described by the following equation:

$$V_2 = \frac{I_1}{sC_2}\qquad\text{Equation 2}$$

For embodiments of the invention in which the $V_1$ voltage is taken as the sinusoidal reference signal, then any step change in the capacitance $C_1$ results in a step change in the $V_1$, when it is assumed that the amplitude of the $I_1$ current does not change instantaneously. As stated above, the $I_1$ current does not change instantaneously because the bulk of the $I_1$ current that flows through the crystal 154 ends up flowing through the inductor 166 (FIG. 14) in the model of the crystal 154.

An advantage of the digital control technique described herein is that the value of the $C_1$ capacitance and/or the $C_2$ capacitance may be changed almost instantaneously with respect to the clock period. In the description below, a "switching event" occurs when capacitance is added to or subtracted from the resonant tank 152 of the oscillator 72.

There are two cases to consider when a switching event occurs and changes either of these capacitances. For purposes of clarifying the discussion below, it is assumed that only the capacitance $C_1$ is changed. However, it is understood that in some embodiments of the invention, the $C_2$ capacitance or a combination of the $C_1$ and $C_2$ capacitances may be changed.

The first case to consider when changing the capacitance $C_1$ is the case where more capacitance is added, i.e., the $C_1$ capacitance increases. If the portion of the capacitance being switched into the circuit is not pre-charged to some value other than zero, then adding a zero charged capacitance at any time other than when the $V_1$ voltage is equal to zero causes charge redistribution and thus, a rapid decrease in the $V_1$ voltage. If the portion of the capacitance being added is pre-charged such that its voltage equals the voltage at the $V_1$ voltage when the switching event occurs, then there is no charge redistribution and hence, no immediate change in the $V_1$ voltage.

Regardless of whether the capacitance being added to increase the $C_1$ capacitance is pre-charged or not, the amplitude of the $V_1$ voltage is smaller after the switching event. If there is no charge redistribution, then at the switching event time, the slope of the waveform of the $V_1$ voltage immediately changes to reflect the new amplitude because the sinusoidal current waveform $I_1$ does not change appreciably as a result of increasing the $C_1$ capacitance.

The next case to consider is when the $C_1$ capacitance decreases, i.e., one or more capacitors are switched out or disconnected from the line 125. For similar reasons to the discussion above regarding increasing the $C_1$ capacitance, decreasing the $C_1$ capacitance may or may not involve charge redistribution. For the selection circuits that are depicted in FIGS. 11 and 12, switching out capacitance does not involve charge redistribution. Therefore, the dominant effect of reducing the $C_1$ capacitance through switching out capacitors is to alter the slope of the waveform of the $V_1$ voltage at the instance of change and an overall amplitude change in the $V_1$ voltage for the remaining oscillation cycles after the event.

Figures 15, 16:
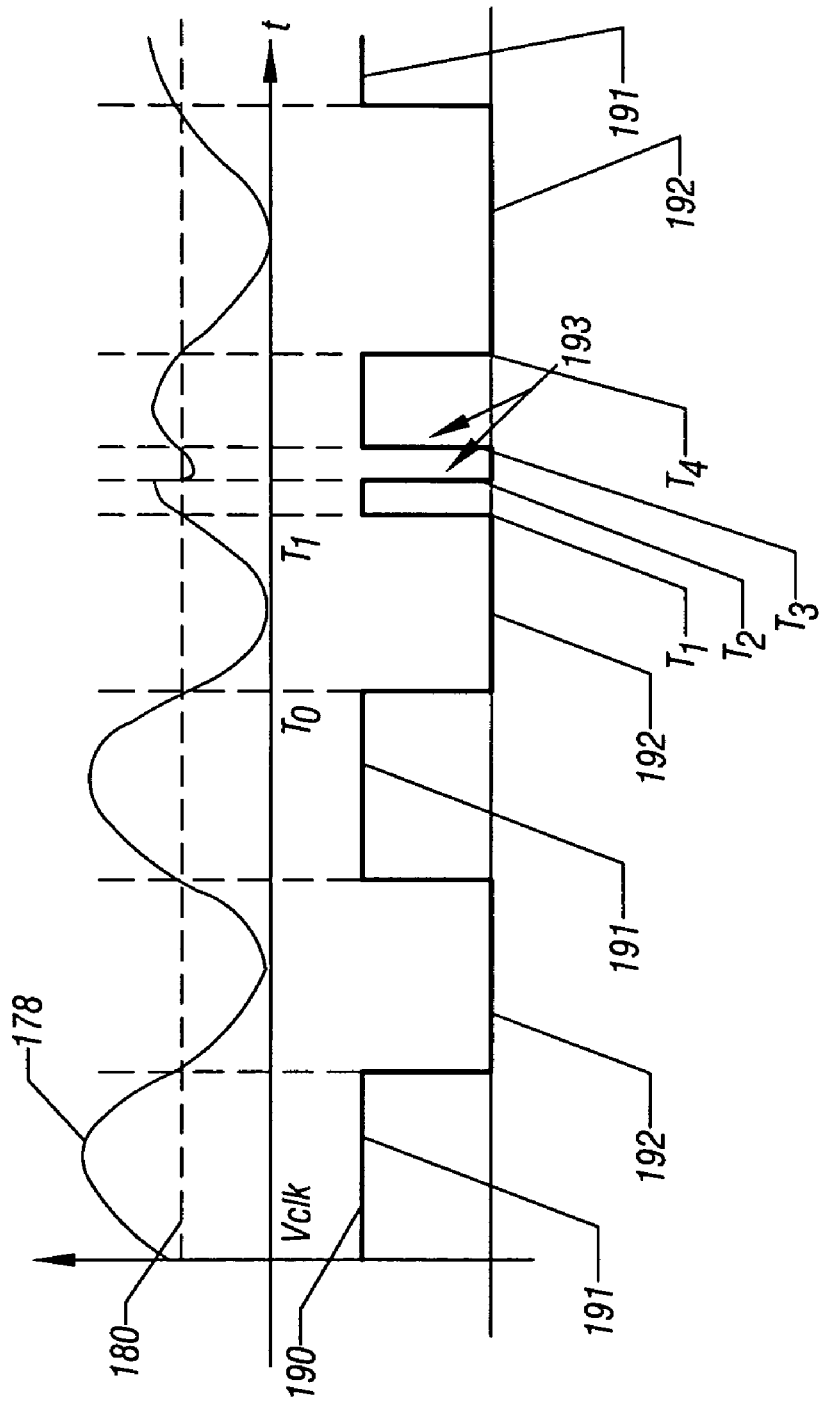
FIGS. 15 and 16 depict waveforms illustrating a potential clock glitch problem.

Because the $V_1$ voltage may be used as the sinusoidal reference signal, this signal may be converted into a clock signal (i.e., the CLK signal (see FIG. 2)) for the rest of the transceiver 32, in some embodiments of the invention. FIG. 15 depicts a possible waveform 178 for such a sinusoidal signal. The waveform 178 passes above and below a logic threshold 180 that may be used by a clock generator (FIG. 2) to convert the sinusoidal reference signal into a clock signal.

An exemplary waveform 190 of such a clock signal is depicted in FIG. 16 for the same time segment over which the waveform 178 occurs. The waveform 190 includes portions 191 that have a logic one value and portions 192 that have a logic zero value. Referring both to FIGS. 15 and 16, when the waveform 178 is above the logic threshold 180, the clock generator generates a logic one pulse 191 in the clock waveform 190. When the waveform 178 is below the logic threshold, the clock generator 74 causes the clock waveform 190 to have a logic zero state 192.

If proper measures are not undertaken, clock glitching may occur due to an instantaneous change in the $C_1$ capacitance. This may especially occur in response to an instantaneous increase in the $C_1$ capacitance. For purposes of illustrating a clock glitch, FIG. 15 depicts that at time $T_1$, a logic one pulse is generated in the clock waveform 190, as the waveform 178 crosses above the logic threshold 180. Ideally, the clock waveform 190 should have about a fifty percent duty cycle. Thus, the logic one pulse should last from time $T_1$ to about time $T_4$, a time in which the waveform 178 crosses back below the logic threshold 180. However, at time $T_2$, the $C_1$ capacitance is increased, such as by switching one or more capacitors between the line (see FIG. 11, for example) 125 and ground. Thus, at time $T_2$, the waveform 178 significantly decreases in that the amplitude of the waveform 178 decreases due to the increased $C_1$ capacitance.

The waveform 178 at time $T_2$ momentarily falls below the logic threshold 180. The waveform 178 remains below the threshold 180 from time $T_2$ to time $T_3$. This decrease in the waveform 178 during the times $T_2$ to $T_3$, in turn, causes the clock waveform 190 to have a logic zero state. Thus, as depicted in FIG. 16, the clock waveform 190 has a momentary "glitch" 193 in that from time $T_2$ to $T_3$, the clock waveform 190 has a logic zero state instead of maintaining of a logic one state. The glitch 193 may effect operation of circuitry of the transceiver 32, in that the circuitry may expect a duty cycle of approximately fifty percent. Thus, such a glitch may effect operation of the transceiver 32.

For purposes of avoiding clock glitching due to switching events, a variety of different techniques may be employed according to the particular embodiment of the invention. For example, in some embodiments of the invention, in implementations in which either the $V_1$ voltage or the $V_2$ voltage is taken as the reference sinusoidal signal and charge redistribution causes the voltage to drop, then a synchronization technique may be used to time the switching event with the sinusoidal output signal. More specifically, in some embodiments of the invention, the communication between the control interface 50 and the oscillator 72 may be timed so that a new frequency control data is communicated to the oscillator 72 during specific portions of the sinusoidal reference signal. In other words, in some embodiments of the invention, the switching event is synchronized to particular time segments of the sinusoidal reference signal.

For example, referring to FIGS. 15 and 16, in some embodiments of the invention, the switching event may be timed to occur during time segments, such as the time segment from time $T_0$ to time $T_1$, of the sinusoidal reference signal in which the signal is below the logic threshold 180. Thus, an increase in the capacitance and thus, a corresponding decrease in the amplitude of the sinusoidal signal, occurs during a time in which the sinusoidal signal is below the logic threshold 180. Therefore, the switching event does not affect the generation of the clock signal. As depicted in FIG. 15, if the change occurring at time $T_2$ were instead moved back in time to occur between time $T_0$ to time $T_1$, then the switching event would not cause the clock waveform 190 to deviate from a fifty percent duty cycle due to a glitch.

Figure 17:
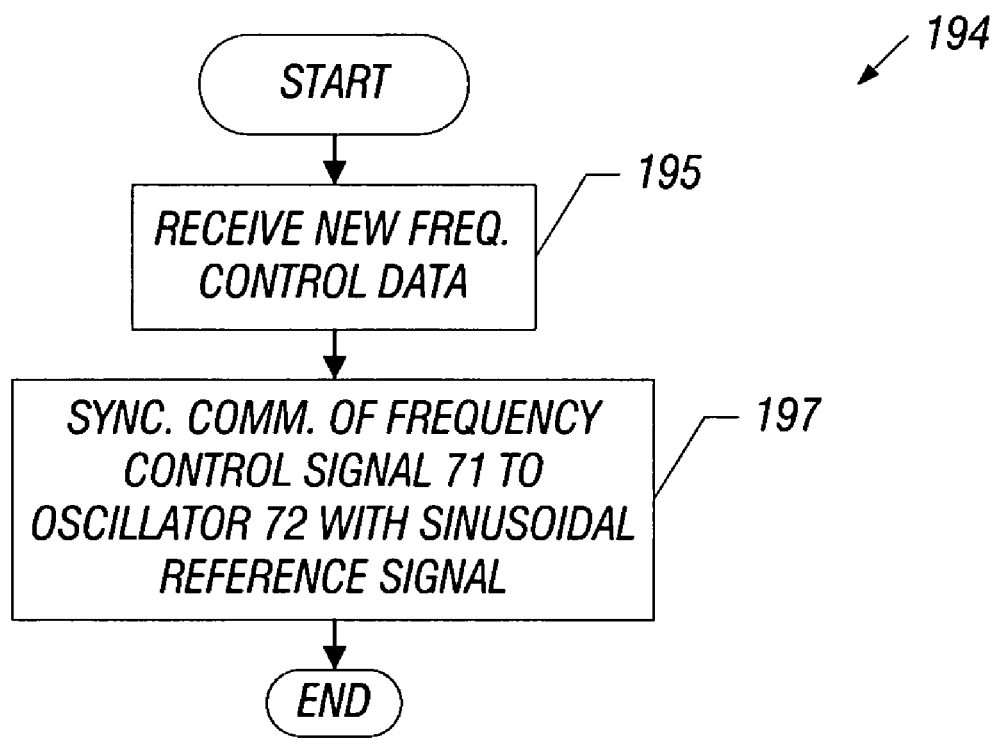
FIG. 17 is a flow diagram depicting a synchronization technique to prevent the occurrence of clock glitches according to an embodiment of the invention.

Referring to FIG. 17, in accordance with an embodiment of the invention, a technique 194 may be used to minimize the occurrence of clock glitches. Pursuant to the technique 194, new frequency control data is received (block 195). For example, the new frequency control data may be received via a write to the register 82 (FIG. 3). Subsequently, the communication of the frequency control signal 71 to the oscillator 72 is synchronized (block 197) with the sinusoidal reference signal.

Figure 18:
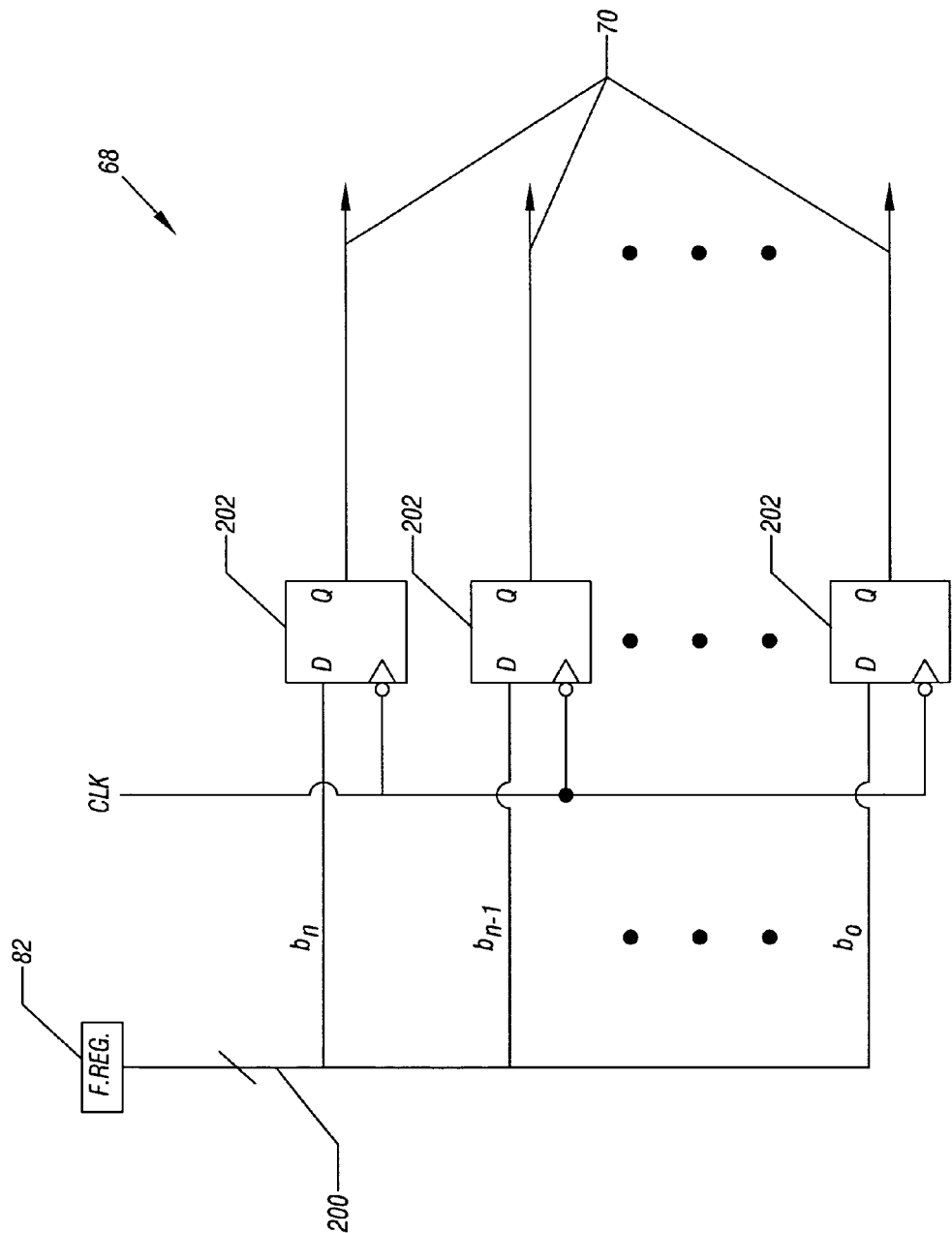
FIG. 18 is a schematic diagram of a digital control interface to synchronize frequency charges according to an embodiment of the invention.

As a more specific example of a possible implementation of synchronization technique 194, FIG. 18 depicts an embodiment of the digital control interface 68 according to a particular embodiment of the invention. The interface 68 includes the fine tuning register 82 that may be written with a particular frequency for the oscillator 72. The bits of the register 82 are communicated through D-type flip-flops 202 to corresponding bit lines of the lines 70. All of the flip-flops 202 are synchronously clocked on the negative-going edge of a clock signal, such as the CLK signal (FIG. 2). Thus, on each negative-going edge of the CLK signal, the lines 70 are refreshed with the contents of the register 82. Therefore, referring back to FIG. 15, due to this scheme, the switching events to change frequency of the oscillator 72 occur only during the logic zero portions of the clock waveform 190.

Other embodiments are within the scope of the appended claims. For example, in an implementation in which the switching event may cause the sinusoidal reference signal to suddenly rise in voltage due to the redistribution of charge from a charge capacitance, then the synchronization technique described above may be triggered on the positive-going edges of the CLK signal.

Figure 19:
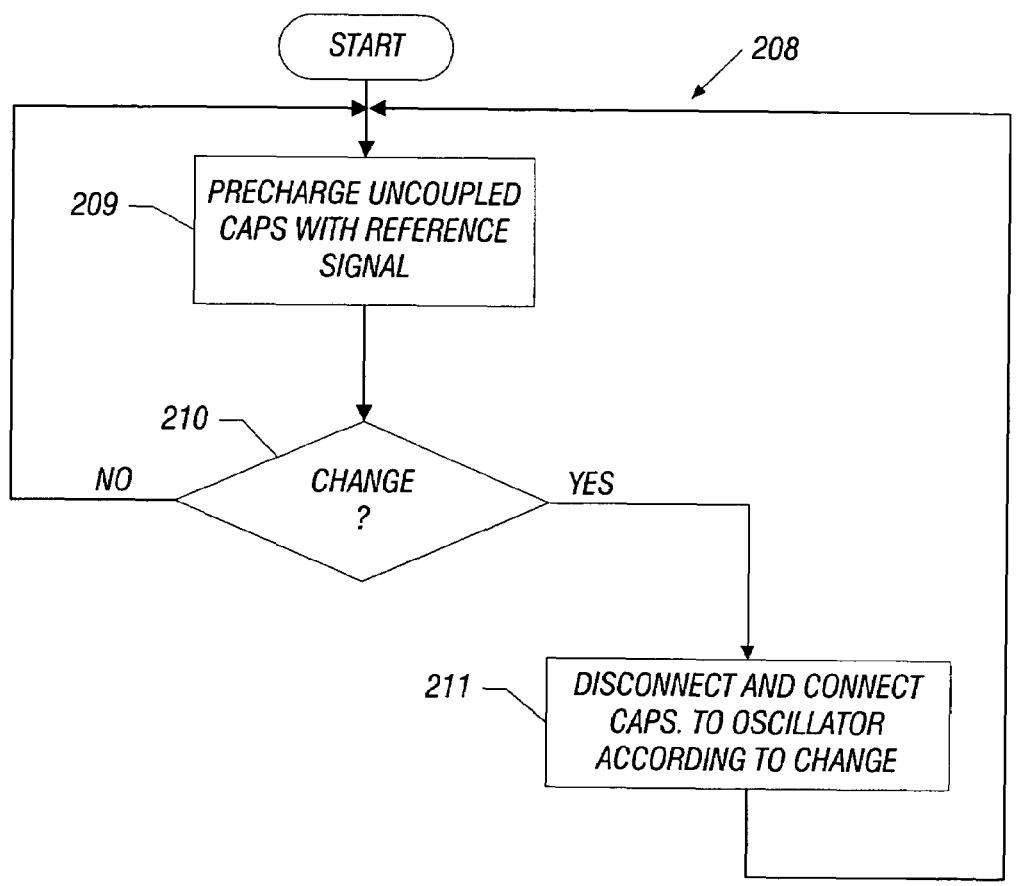
FIG. 19 depicts a precharge technique to minimize the occurrence of clock glitches according to an embodiment of the invention.

Another technique to avoid clock glitching is to ensure that charge redistribution does not occur at all by forcing all capacitance which is not currently switched into the resonant tank circuit at a given time to follow the sinusoidal reference signal. Thus, referring to FIG. 19, in an embodiment of the invention, a technique 208 includes precharging uncoupled capacitors with the sinusoidal reference signal, as depicted in block 209. If a change occurs in the frequency data that is written to the register 82 (as depicted in diamond 210), then the capacitors are connected and disconnected to the oscillator tank accordingly, as depicted in block 211.

Figure 20:
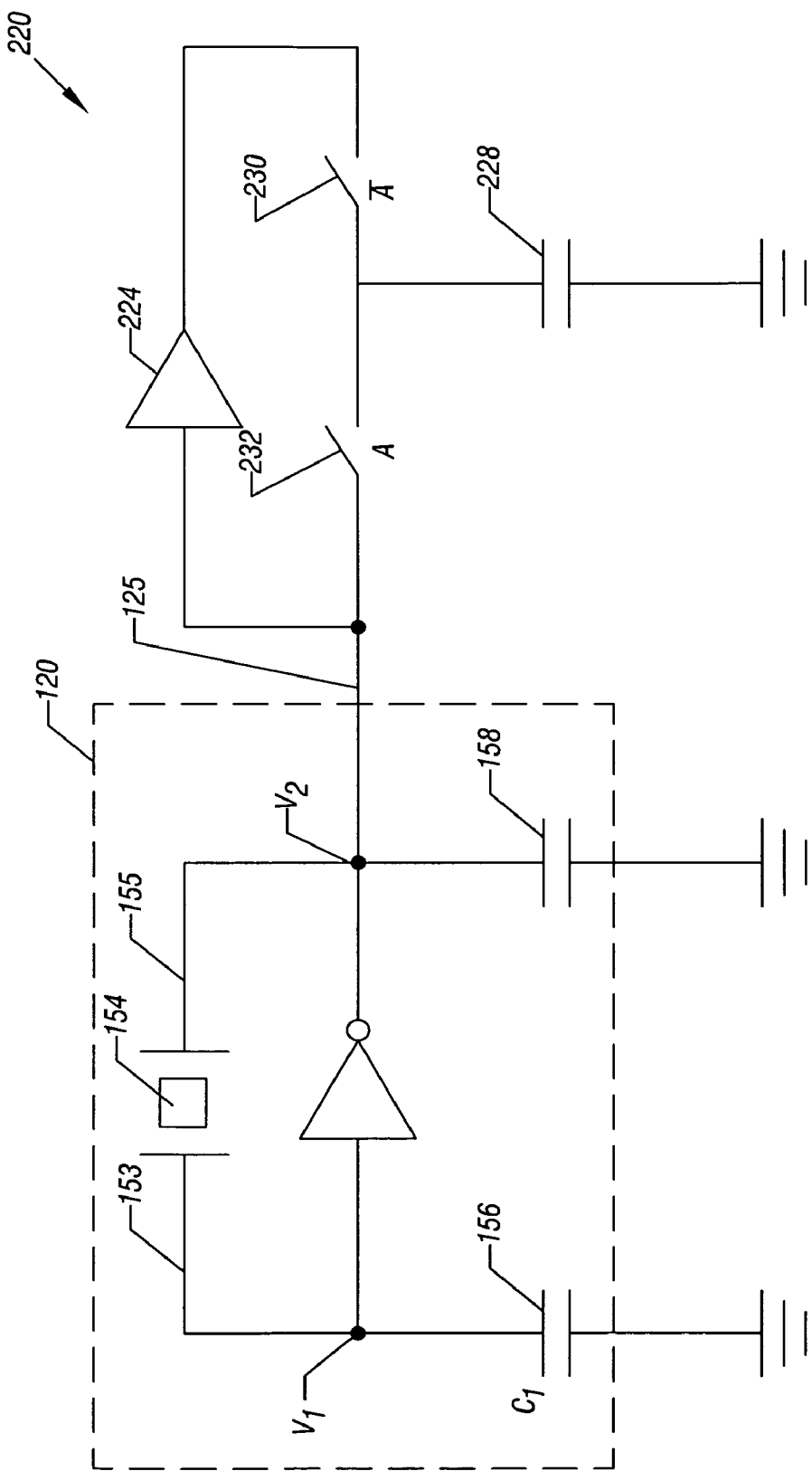
FIG. 20 is a schematic diagram of a circuit to precharge capacitors that are not coupled to the oscillator core to minimize the occurrence of clock glitches according to an embodiment of the invention.

As a more specific example, FIG. 20 depicts a circuit 220 to precharge capacitors that are not connected to the oscillator tank 120. In this regard, a capacitor 228 of the circuit 220 represents an exemplary set of one or more capacitors that are collectively either coupled to or not coupled to the resonant tank 120. For the case in which the capacitor 228 is not coupled to the tank 120, a switch 232 is open and a switch 230 is closed to couple the capacitor 228 to the output terminal of a voltage follower 224, a unity gain amplifier. The amplifier 224 provides an indication of the reference sinusoidal signal to the capacitor 228. More specifically, the input terminal of the voltage follower 224 is coupled to the $V_2$ node in this example. When the capacitor 228 is coupled to the tank 120, however, the switch 230 is opened and a switch 232 is closed to couple the capacitor 228 to the tank 120.

Figure 21:
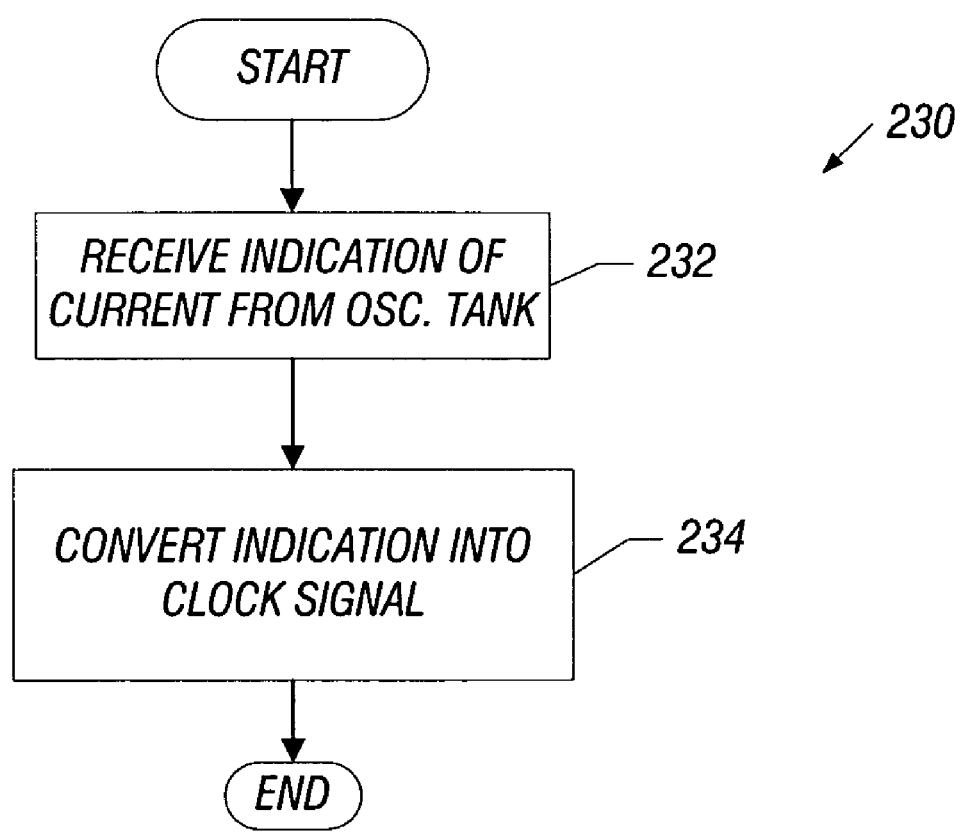
FIG. 21 is a flow diagram depicting a technique to generate a clock signal from an indication of a current in the oscillator core according to an embodiment of the invention.

Another technique 230 to minimize the occurrence of clock glitches is depicted in FIG. 21. Referring to FIG. 21, the technique 230 includes receiving (block 232) an indication of the current from the oscillator tank. For example, referring back to FIG. 13, this current may be the $I_1$ current for a Colpitts-type oscillator, in some embodiments of the invention. Still referring to FIG. 21, this indication is then converted into the clock signal, as depicted in block 234.

Because the $I_1$ current remains relatively constant, an indication of this current also remains relatively constant and thus, is not significantly affected by switching events. Therefore, due to the insensitivity of the $I_1$ current to switching events, the technique 230 prevents the occurrence of clock glitches.

Figure 22:
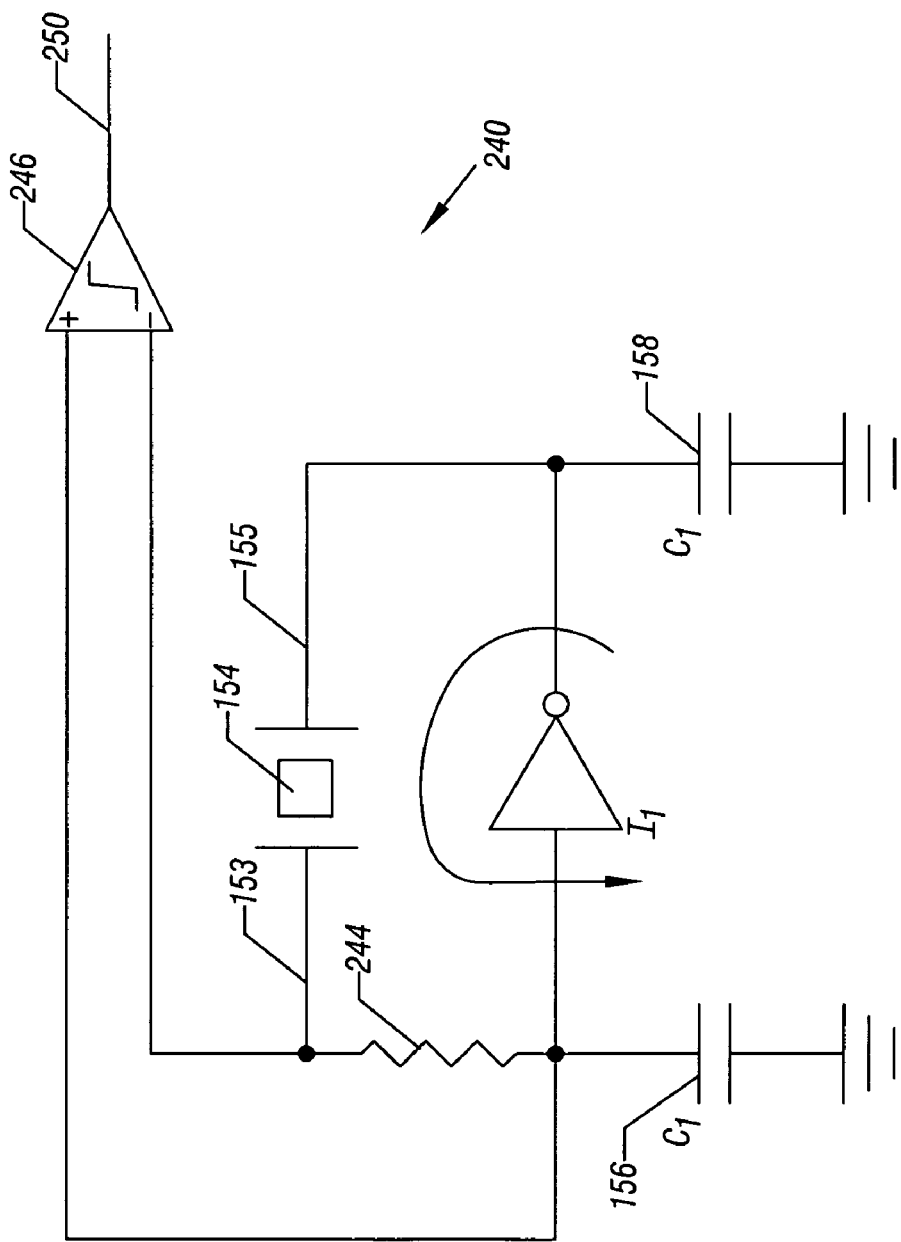
FIG. 22 is a schematic diagram depicting a circuit to generate a clock signal from an indication of a current in the oscillator core according to an embodiment of the invention.

As a more specific example, FIG. 22 depicts a circuit 240 to generate a clock signal from the $I_1$ current. As shown in FIG. 22, the resonant tank has the same design as the resonant tank 154 (FIG. 13) depicted above, however, the tank includes a resistor 244 that is effectively coupled in series with the $I_1$ current. An amplifier 246 (part of the clock generator 74 (FIG. 2), for example) has its input terminals coupled across the resistor 244 to receive a voltage that is indicative of the $I_1$ current. The amplifier 246, in turn, may be an amplitude-limiting amplifier (a comparator, for example) that generates a square wave clock signal in response to the voltage across the resistor 244. It is noted that the resistor 244 may be connected anywhere in series with the $I_1$ current.

Digital circuitry applications may impose a duty cycle error restriction on a reference clock signal. The duty cycle error restriction specifies the maximum allowable deviation of the duty cycle of the clock waveform from fifty percent. This deviation (called "duty_cycle_error") is described below:

$$\text{duty\_cycle\_error} = +/- \left| \frac{t_{HIGH}}{T_0} - 0.5 \right|, \quad \text{Equation 3}$$

wherein "$t_{HIGH}$" represents the logic high time; and "$T_0$" represents the fundamental clock period.

In order to convert a sinusoidal waveform into a square wave clock signal that has a fifty percent duty cycle, the logic threshold that needs to be used in order to correctly define the logic high and low levels is precisely the common mode, or average, of the sinusoidal waveform. The logic threshold 180 (FIG. 15) is one such threshold.

The average value of the $V_1$ voltage may be determined by using a low pass filter. Another technique is to use a high pass filter to only pass the AC component of the sinusoidal signal and then to establish a known threshold for high/low decision making.

When a switching event occurs, charge re-distribution and oscillation amplitude change effects along with the non-linear properties inherent in the architecture may cause a step change in the common mode (or average DC value) of the $V_1$ and $V_2$ voltages. The magnitude of the step change of the common mode value is found to be proportional to the fractional change in capacitance of $C_1$. Thus, a smaller step change in the $C_1$ capacitance results in a smaller step change in the common mode value of $V_1$.

More specifically, for the case in which a low pass filter is used to generate the common mode value, the error persists until the time constant of the low pass filter permits the average value to settle back to fifty percent. A similar effect may occur with the use of a high pass filter in that the high pass filter introduces a time constant that must be overcome for purposes of obtaining the fifty percent duty cycle.

Figure 23:
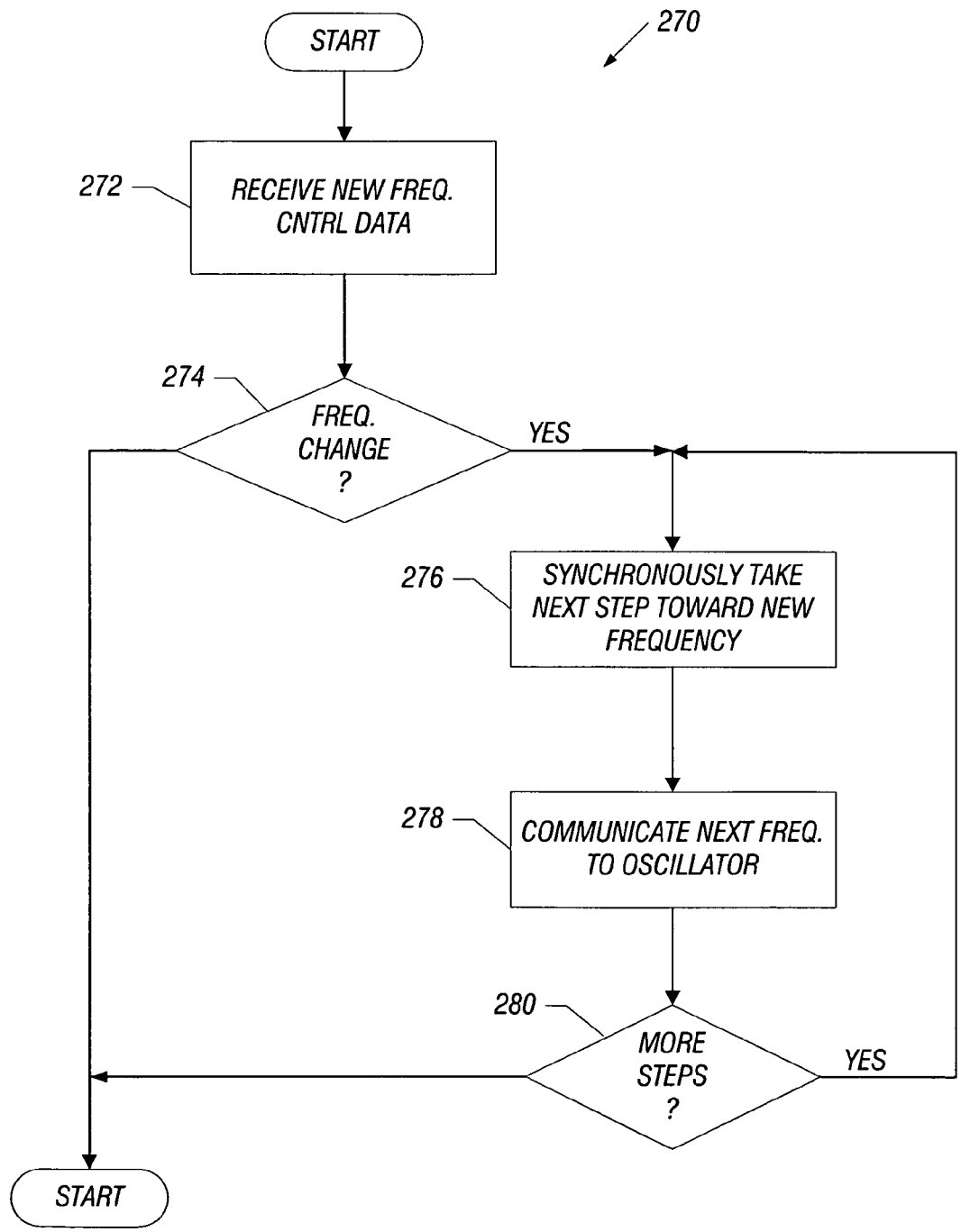
FIG. 23 is a flow diagram depicting a technique to monotonically change a frequency of the oscillator to regulate the duty cycle of a reference clock signal according to an embodiment of the invention.

For purposes of not violating the duty cycle requirement of the digital circuitry using the sinusoidal clock signal, a technique 270 that is depicted in FIG. 23 may be used in some embodiments of the invention. The technique 270 includes receiving new frequency control data, as depicted in block 272. If a determination (diamond 274) is made that a frequency change occurred, then the technique 270 includes taking the next step (a frequency increase or decrease, as appropriate) toward the new frequency, as depicted in block 276. The next frequency is then communicated (via the digital control signal 71) to the oscillator, as depicted in block 278. If more steps are needed (diamond 280), then control returns to block 276. Otherwise, the frequency change has been effected.

Figure 24:
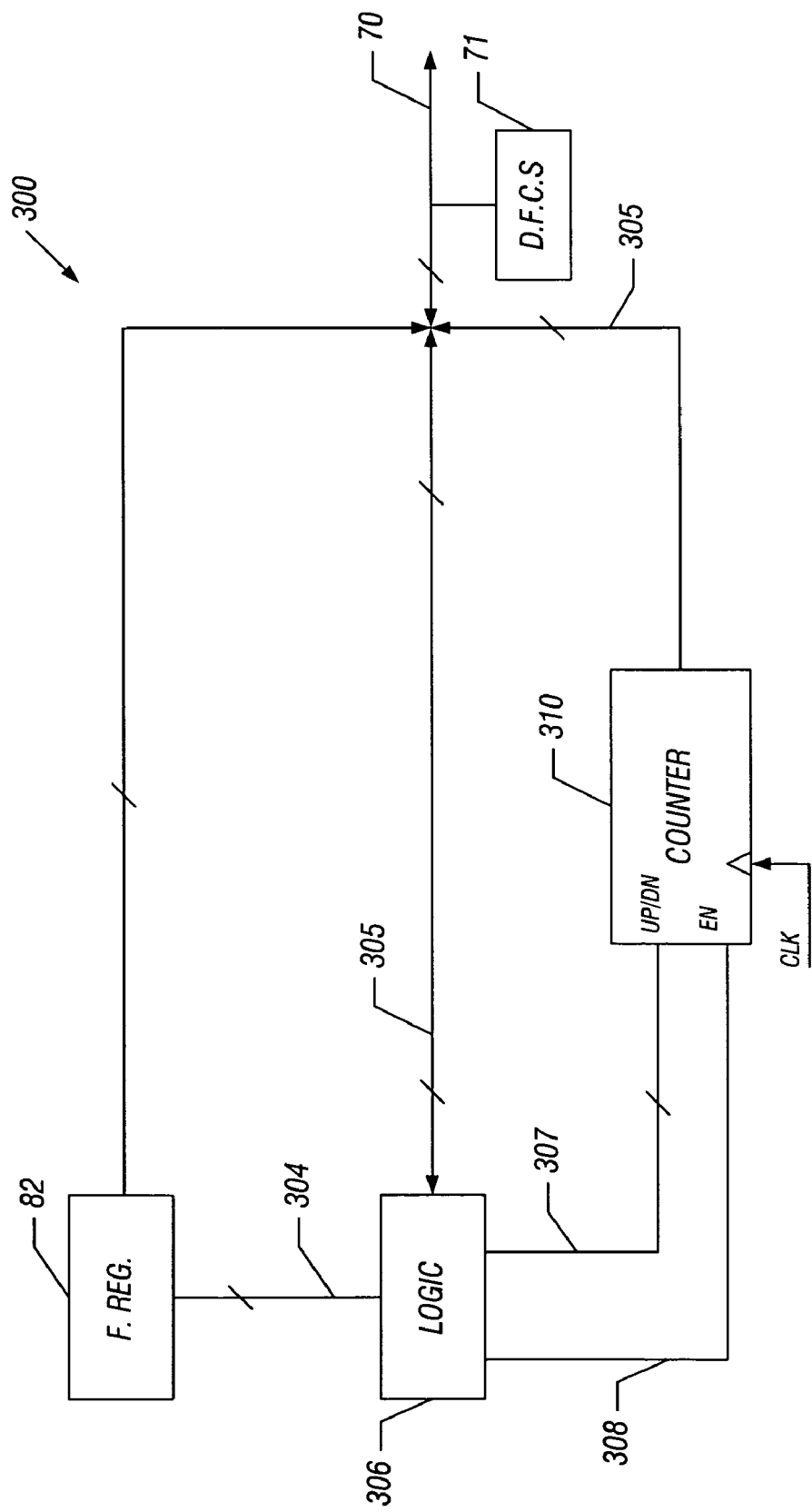
FIG. 24 depicts a circuit to monotonically change the frequency of the oscillator to regulate the duty cycle of a reference clock signal according to an embodiment of the invention.

Thus, the technique 270 effectively limits the time rate at which the capacitance may change. In some embodiments of the invention, the technique 270 forces the circuitry to walk monotonically from one digitally encoded capacitance value to another over a length of time that allows some designed maximum step change in capacitance per clock cycle. An example of a circuit 300 to generate this stepping is depicted in FIG. 24. The circuit 300 may be part of the digital control interface 63 (FIG. 3), in some embodiments of the invention. In other embodiments of the invention, the circuit 300 may be part of the analog control interface.

Referring to FIG. 24, the circuit 300 includes logic 306 that, via communication lines 304, receives an indication of frequency control data. This frequency control data may be stored in the fine tuning register 82, for example. The logic 306 compares this frequency control data to the value indicated by the output terminals 305 of a counter 310. The counter 310, in turn, controls the digital frequency control signal 71 that appears on the lines 70 that communicate the data to the oscillator 72. Thus, the value stored in the counter 310 is the value used to switch the capacitors and establish the appropriate operating frequency of the oscillator 72.

The counter 310 is constructed to count every Y cycles of the CLK clock signal to limit the rate at which switching events occur. Furthermore, the counter 310 is constructed to count down or count up (depending on which is appropriate) toward the value stored in the fine tuning register 82. Thus, the logic 306 compares the values stored in the counter 310 with the corresponding value stored in the fine tuning register 82. If these values are different, then the logic 306 instructs (via the control lines 307) the counter 310 to either count up or down (depending on the direction that is needed) toward the value that is stored in the register 82. Upon determining that a change is needed, the logic 306 also enables (via communication line 308) the counting operation of the counter 310.

Therefore, the counter 310 counts monotonically upward or downward toward the frequency that is indicated by the data that is stored in the register 82. However, the rate at which the counter 310 counts toward the desired frequency control word is limited by the clocking action of the counter 310 in that the counter 310 only transitions states every Y CLK cycles. In some embodiments of the invention, the value of "Y" is determined by design and duty cycle requirements. Furthermore, in some embodiments of the invention, the counter 310 only provides the most significant bits (MSBs) of the digital frequency control signal 71, frequency control data to the lines 70, as the least significant bits are provided by the corresponding least significant bits of the register 82. Thus, many variations are possible and are within the scope of the appended claims.

Another technique to ensure that the duty cycle requirement is met is to use the circuit 240 that is depicted in FIG. 22, as this circuitry depends on the $I_1$ current that varies little in response to a change in the $C_1$ capacitance. However, the circuit 240 may be not be best solution with regards to practical implementation issues and performance degradation issues that are associated with adding resistive loss into the oscillator tank circuit.

Figure 25:
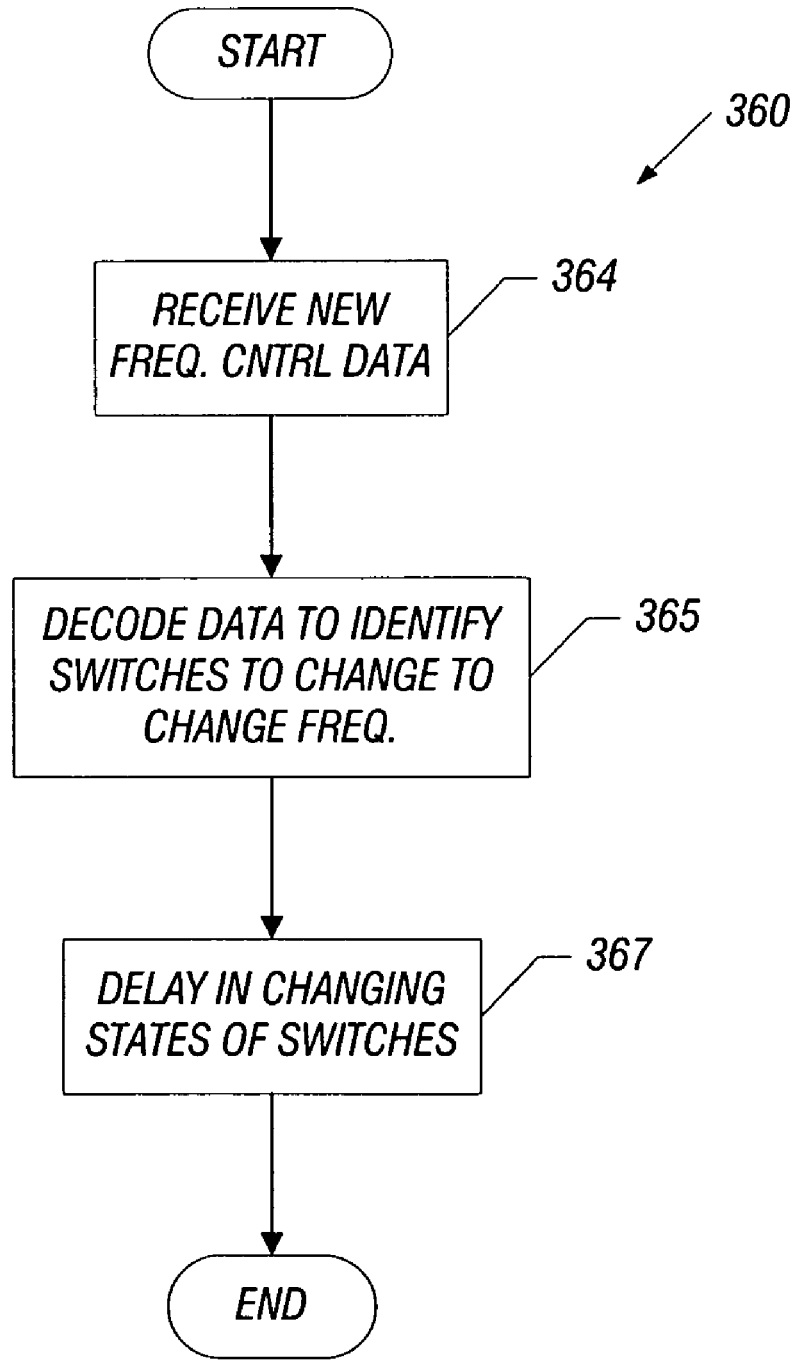
FIG. 25 is a flow diagram depicting a delay technique to regulate the duty cycle of a reference clock signal according to an embodiment of the invention.

FIG. 25 depicts another technique 360 to ensure that the duty cycle requirement is met. The technique 360 includes receiving new frequency control data, as depicted in block 364. The data is then decoded (block 365) to identify switches to change the frequency. In this manner, the new data indicates the activation of previously-deactivated switches and the de-activation of previously-activated switches. After the decoding, the technique 360 includes delaying in changing the states of the switches, as depicted in block 367. Thus, in some embodiments of the invention, the decoding may be intentionally delayed for purposes of slowing down the rate at which the overall capacitance $C_1$ changes.

Figure 26:
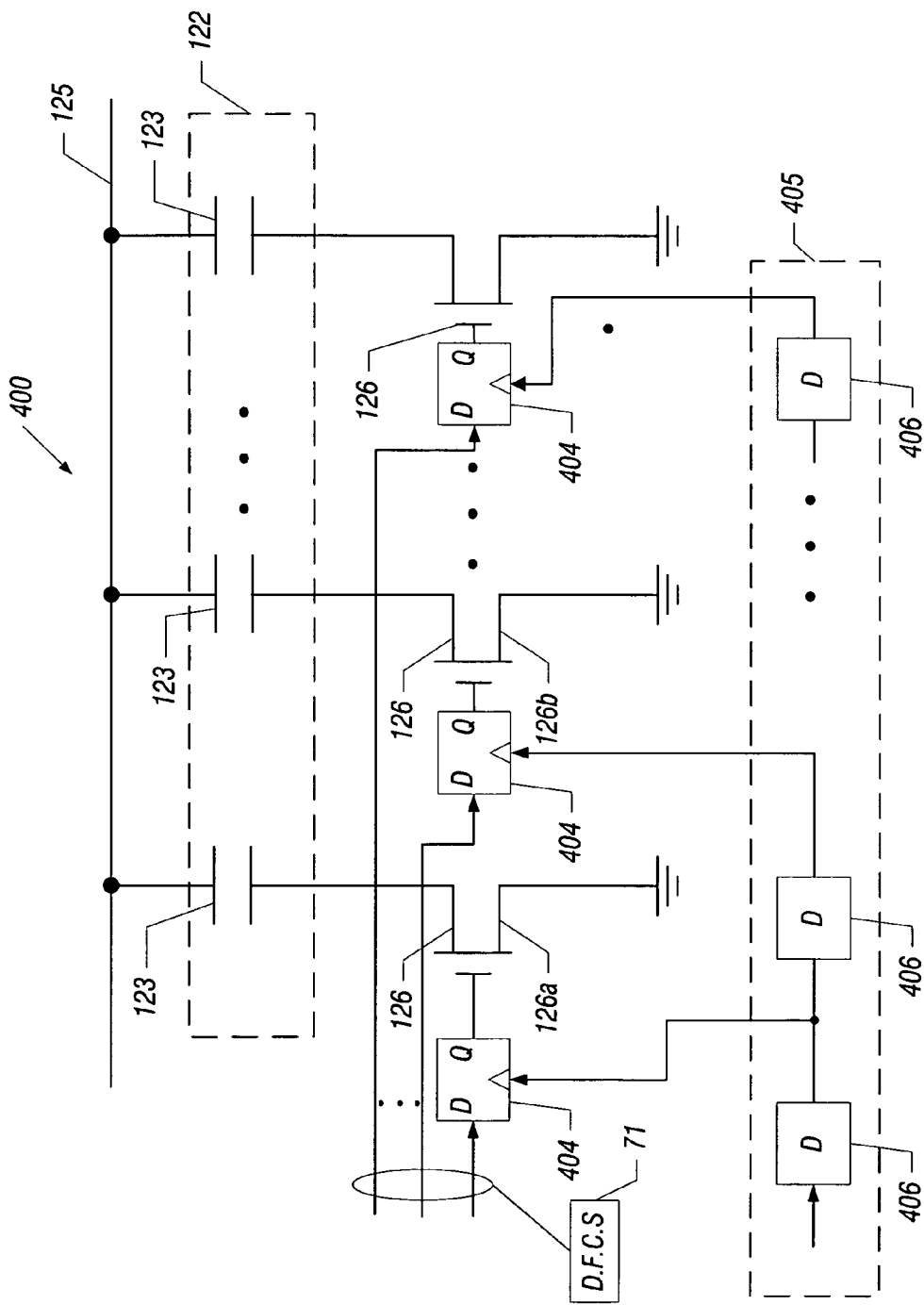
FIG. 26 is a schematic diagram depicting a decoding circuit to regulate the duty cycle of a reference clock signal according to an embodiment of the invention.

As a more specific example, FIG. 26 depicts a circuit 400 that includes nMOSFETs 126 for purposes of selectively coupling capacitors 123 to ground to effectively add capacitance to the line 125. The circuit 400, for purposes of example, is similar to the circuit depicted in FIG. 11 with the following changes. The changes include the addition of a delay line 405 that includes serially-coupled delay elements 406. The beginning point of the chain 405 receives a pulse (at an input terminal 407) when a switching event occurs. This pulse propagates through the delay chain such that the nMOSFETs 126 are available to, one at a time, be activated in accordance with the digital frequency control signal 71.

Each of the delay elements 406 has an output terminal that is coupled to the clock terminal of a D-type flip-flop 404. The input terminal of the flip-flop 404, in turn, receives a decode signal, such as one bit of the digital frequency control signal 71, to activate the associated nMOSFET 126. Thus, similar to the circuit that is depicted in FIG. 11, when the decode signal for the particular nMOSFET 126 is asserted, the associated nMOSFET 126 is activated to couple additional capacitance to the line 125. However, unlike the circuit depicted in FIG. 11, the circuit 400 has an additional delay that is introduced by the delay chain 405. Thus, the transistor 126a is eligible to be activated/de-activated before the transistor 126b, etc.

In some embodiments of the invention, the rate at which the $C_1$ capacitance changes may be controlled in software. In this manner, in some embodiments of the invention, the baseband subsystem 58 may include memory and a processor that is coupled to the memory. The memory may store instructions that when executed by the processor causes the processor to communicate frequency changes to the transceiver 32 in accordance with a technique 420 that is depicted in FIG. 27.

Figure 27:
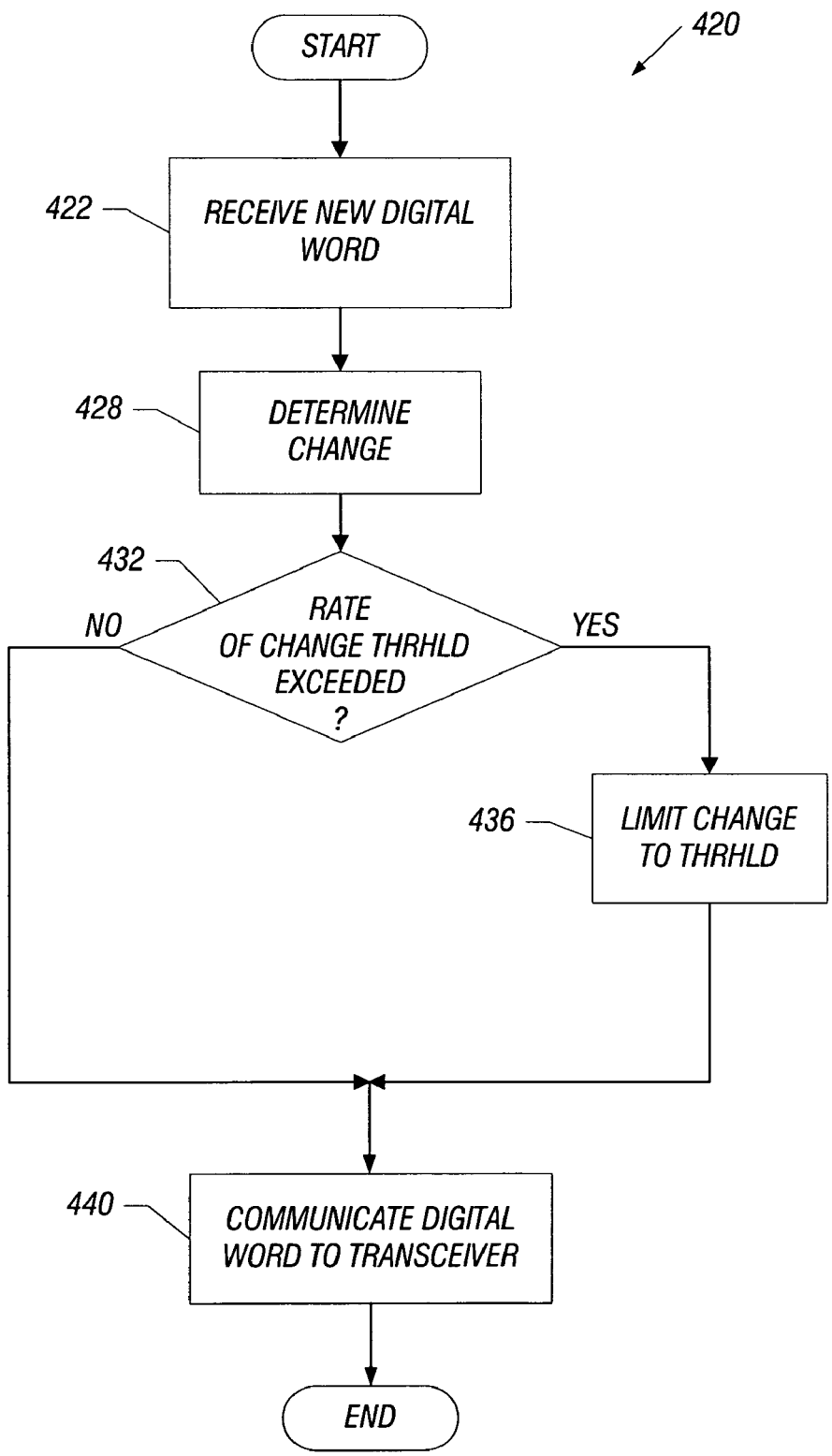
FIG. 27 depicts a technique to control the rate at which the oscillation frequency changes to regulate the duty cycle of a reference clock signal according to an embodiment of the invention.

Referring to FIG. 27, pursuant to the technique 420, the processor 510 receives (block 422) a new digital word indicative of a new frequency. Next, the processor 510 determines (block 428) the change in the frequency. If the processor 510 subsequently determines (432) at the rate of change exceeds a rate of change threshold, then the processor 510 limits (block 436) the change to the threshold. In other words, the rate at which the frequency can change is limited by the processor 510. Subsequently, pursuant to the technique 420, the processor 510 communicates (block 440) the rate-limited word to the RF transceiver 32.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method comprising:
selectively coupling impedances to an oscillator to establish a first frequency of operation of the oscillator;
repeating the coupling in a feedback loop to cause the first frequency to be near a second frequency of a wireless signal; and
delaying the selective coupling to impose a rate limit at which the first frequency changes.

2. The method of claim 1, wherein the second frequency comprises a frequency of a wireless signal.

3. The method of claim 1, further comprising:
using the oscillator to establish a reference frequency for a transceiver.

4. The method of claim 1, wherein the act of selectively coupling comprises:
selectively coupling capacitive elements to the oscillator.

5. The method of claim 1, wherein the act of selectively coupling comprises:
selectively coupling the impedances to an oscillator tank of the oscillator.

6. The method of claim 1, wherein the selective coupling occurs in response to digital data indicative of the first frequency.

7. The method of claim 6, further comprising:
delaying the selective coupling to impose a rate limit at which the first frequency changes.

8. The method of claim 1, further comprising:
associating switches with bits of the digital data, wherein the act of selectively coupling comprises selectively activating the switches to couple the impedances to the oscillator.

9. The method of claim 1, wherein the repeating the changing adjusts the first frequency within a first resolution, the method further comprising:
adjusting the first frequency outside of the feedback within a second resolution larger than the first resolution.

10. The method of claim 1, further comprising:
using the oscillator to generate a signal;
synchronizing the selective coupling in response to a timing of a signal generated by the oscillator.

11. The method of claim 1, further comprising:
precharging at least some of the impedances when not coupled to the oscillator.

12. The method of claim 11, further comprising:
using the oscillator to generate a signal, wherein
the precharging comprises coupling at least some of the impedances to the signal.

13. An apparatus comprising:
impedances;
an oscillator core; and
a circuit to selectively couple the impedances to the oscillator core to establish a first frequency of operation of the oscillator core and repeat the coupling in a feedback loop to cause the first frequency to be near a second frequency of a wireless signal, and regulate the selective coupling of the impedances to the oscillator core to control a rate at which a total impedance coupled to the oscillator core changes to impose a limit on a rate at which the first frequency changes.

14. The apparatus of claim 13, wherein the second frequency comprises a frequency of a wireless signal.

15. The apparatus of claim 13, further comprising:

a radio frequency receiver to synchronize an operation to the first frequency.

16. The apparatus of claim 13, further comprising:

a radio frequency transmitter to synchronize an operation to the first frequency.

17. The apparatus of claim 13, wherein the circuit selectively couples capacitive elements to the oscillator core to establish the first frequency.

18. The apparatus of claim 13, wherein the circuit selective couples the impedances in response to digital data indicative of the first frequency.

19. The apparatus of claim 13, further comprising switches, wherein the circuit, in response to the digital data, drives the switches with signals to cause the switches to selectively couple the impedance elements to the oscillator and delays the driving to impose the rate limit.

20. The apparatus of claim 13, wherein the oscillator generates a signal and the circuit synchronizes the selective coupling in response to a timing of a signal generated by the oscillator.

21. The apparatus of claim 13, wherein the circuit precharges at least some of the impedances when not coupled to the oscillator.

22. A method comprising:

selectively coupling impedances to an oscillator to establish a first frequency of operation of the oscillator;

repeating the coupling in a feedback loop to cause the first frequency to be near a second frequency of a wireless signal; and precharging at least some of the impedances when not capacitively coupled to a resonant tank of the oscillator.

23. The method of claim 22, further comprising:

using the oscillator to generate a signal, wherein the precharging comprises coupling at least some of the impedances to the signal.

* * * * *